(12) United States Patent
Steeman et al.

(10) Patent No.: US 11,485,865 B2
(45) Date of Patent: Nov. 1, 2022

(54) THERMOSETTING COMPOSITIONS AND FORMING THREE-DIMENSIONAL OBJECTS THEREFROM

(71) Applicant: Covestro (Netherlands) B.V., Nieuwegein (NL)

(72) Inventors: Paulus Antonius Maria Steeman, Echt (NL); Marco Marcus Matheus Driessen, Echt (NL)

(73) Assignee: Covestro (Netherlands) B.V., Geleen (NL)

(*) Notice: Subject to any disclaimer, the term of this patent is extended or adjusted under 35 U.S.C. 154(b) by 458 days.

(21) Appl. No.: 16/344,488

(22) PCT Filed: Oct. 30, 2017

(86) PCT No.: PCT/EP2017/077782
§ 371 (c)(1),
(2) Date: Apr. 24, 2019

(87) PCT Pub. No.: WO2018/078160
PCT Pub. Date: May 3, 2018

(65) Prior Publication Data
US 2019/0249018 A1    Aug. 15, 2019

(30) Foreign Application Priority Data

Oct. 28, 2016  (EP) ..................... 16196334
Oct. 28, 2016  (EP) ..................... 16196338

(51) Int. Cl.
| | | |
|---|---|---|
| C09D 11/101 | (2014.01) | |
| B33Y 70/00 | (2020.01) | |
| B33Y 10/00 | (2015.01) | |
| B29C 64/124 | (2017.01) | |
| C09D 11/102 | (2014.01) | |
| C08F 290/06 | (2006.01) | |
| C09D 11/104 | (2014.01) | |
| C09D 11/107 | (2014.01) | |
| C09D 11/30 | (2014.01) | |
| B29C 64/153 | (2017.01) | |
| G03F 7/038 | (2006.01) | |

(52) U.S. Cl.
CPC .......... *C09D 11/101* (2013.01); *B29C 64/124* (2017.08); *B33Y 10/00* (2014.12); *B33Y 70/00* (2014.12); *C08F 290/061* (2013.01); *C08F 290/064* (2013.01); *C09D 11/102* (2013.01); *C09D 11/104* (2013.01); *C09D 11/107* (2013.01); *C09D 11/30* (2013.01); *B29C 64/153* (2017.08); *G03F 7/0388* (2013.01)

(58) Field of Classification Search
CPC ..... G03F 7/0388; C09D 11/30; C09D 11/107; C09D 11/104; C09D 11/102; C09D 11/101; C08G 63/183; C08F 290/061; C08F 290/064; C08F 220/10; C08F 2/50; B33Y 10/00; B33Y 70/00; B29C 64/153; B29C 64/124
See application file for complete search history.

(56) References Cited

U.S. PATENT DOCUMENTS

| | | | |
|---|---|---|---|
| 5,566,027 A | 10/1996 | Saitoh et al. | |
| 10,994,479 B2* | 5/2021 | Jansen | ............... C08K 5/14 |
| 2005/0084123 A1 | 4/2005 | Litke et al. | |
| 2010/0190881 A1 | 7/2010 | Steinmann | |
| 2011/0104500 A1 | 5/2011 | Southwell et al. | |

FOREIGN PATENT DOCUMENTS

| | | |
|---|---|---|
| EP | 1918316 A1 | 5/2008 |
| EP | 1985674 A1 | 10/2008 |
| WO | 03093901 A1 | 11/2003 |
| WO | 2010104603 A2 | 9/2010 |

OTHER PUBLICATIONS

International Search Report dated Feb. 12, 2018.

* cited by examiner

Primary Examiner — Sanza L. McClendon
(74) Attorney, Agent, or Firm — Jed C. Benson

(57) ABSTRACT

Thermoset compositions and methods for forming three-dimensional articles via an additive fabrication process, and articles made therefrom are disclosed herein. In an embodiment, a composition comprises a first network-forming component comprising a TPA-based polyester comprising a backbone and having at least 2 polymerizable groups, one or more first network monomers, and a first network initiator. The backbone of the TPA-based polyester comprises the reaction product of a terephthalic acid and a polyol. The composition may further comprise a second network-forming component.

19 Claims, 2 Drawing Sheets

US 11,485,865 B2

THERMOSETTING COMPOSITIONS AND FORMING THREE-DIMENSIONAL OBJECTS THEREFROM

This application is the U.S. national phase of International Application No. PCT/EP2017/077782, filed 30 Oct. 2017, which designated the EP and claims priority to the following EP Application No.'s: 1619334.3, filed 28 Oct. 2016 and 16196338.4, filed 28 Oct. 2016. The entirety of the contents of each of these applications is hereby incorporated by reference as if fully set forth herein.

FIELD

The invention relates to thermosetting compositions and methods for producing three-dimensional objects by additive fabrication techniques, and articles produced therefrom.

BACKGROUND

Additive fabrication, also known as three-dimensional printing, is a technique for forming three-dimensional objects from computer data by building up objects one portion at a time until a final three-dimensional object is produced. Additive techniques can be contrasted with subtractive techniques, such as milling, wherein portions of material are removed from a larger amount of material to produce the final three-dimensional object.

Various types of materials are used in additive fabrication processes. Generally, thermoplastic materials are used in, for example fused filament fabrication (FFF) and selective laser sintering (SLS) processes, whereas thermoset materials are used in, for example vat based processes and processes that involve jetting of liquid materials.

Generally, electromagnetic radiation is used to encourage rapid curing of the thermosetting materials. The electromagnetic radiation may be UV, visible, or infrared light and may be applied, for example, by lasers, lamps, or LEDs. The electromagnetic radiation may be applied selectively, e.g. by drawing a specific pattern with a laser, using a digital micromirror device (DMD), or a mask, or unselectively, e.g. by passing a lamp over the entirety of a surface. Post-processing by applying additional temperature or light to the newly formed three-dimensional object may be necessary to achieve the desired properties of a three-dimensional object formed from a thermosetting composition.

Various advances have been made to thermosetting materials for additive fabrication to improve the mechanical properties of the finished article. For example, US2010/0304088 describes a radiation curable resin composition comprising cationically polymerizable components and an impact modifier that, after full cure, results in a material having a high tensile modulus and high toughness, as shown by high impact strength and/or high resistance against crack propagation.

In US2011/0104500, there is described a radiation curable resin that, upon cure, attains a desirable combination of modulus, impact strength, heat deflection temperature, and water absorption. The radiation curable resin comprises a combination of epoxy functional components, an oxetane component, a (meth) acrylate component, an impact modifier, a free-radical photo-initiators, and a cationic photo-initiator.

Although various advances have been made to thermosetting materials for additive fabrication in recent years, the industry continues to demand better mechanical properties. An example of a material that has not yet been realized is a photo-polymerizable material that simultaneously achieves high glass transition temperature (Tg) and high toughness.

SUMMARY

The invention employs a polyester comprising i) a backbone comprising the reaction product of a terephthalic acid (TPA) and a polyol, and ii) a number average of at least two polymerizable groups per molecule, wherein the polymerizable groups comprise acrylate, methacrylate, epoxy, oxetane, hydroxyl, itaconate, vinyl ether, allyl ether, maleate, or fumarate (hereinafter, "TPA-based polyester"). The TPA-based polyester has a number average molecular weight of from 800 to 10,000 g/mol and a glass transition temperature (Tg) of 40° C. or more. The TPA-based polyesters may be employed in compositions, such as compositions for forming a three-dimensional object via an additive fabrication processes, or as a kit of materials, which forms a composition when the elements of the kit of materials are combined.

In an embodiment, the TPA-based polyester is present in a composition as part of a first-network forming component consisting of 19.95 to 80 wt % of the TPA-based polyester, 19.95 to 80 wt % of one or more first network monomers having a number average of 0.95 to 1.1 polymerizable groups, 0.05 to 5 wt % of one or more first network-forming initiators, and, optionally, up to 15 wt % of one or more further first network, monomers, oligomers, or polymers having a number average of 2 or more polymerizable groups. The substituents of the first network-forming component are able to (co)polymerize with the polymerizable groups of the TPA-based polyester and/or the one or more first-network monomers. If a component of the polymerizable composition cannot (co)polymerize with any of the first network-forming components then the component cannot be a first network-forming component. Particulate fillers that comprise polymerizable groups that are able to (co)polymerize with the polymerizable groups of the TPA-based polyester are not part of the first network-forming component.

An optional second network-forming component may be present in the composition. The second network-forming component comprises one or more second network compounds that comprise polymerizable groups that do not (co)polymerize with the polymerizable groups of the TPA-based polyester, and a second network initiator for initiating polymerization of the one or more second network compounds.

The components of the composition may also be separated and provided as a kit of materials. Further embodiments of the invention are described below.

BRIEF DESCRIPTION OF THE DRAWINGS

Various features and characteristics of the inventions described in this specification may be better understood by reference to the accompanying figures, in which.

DETAILED DESCRIPTION

Figure 1:
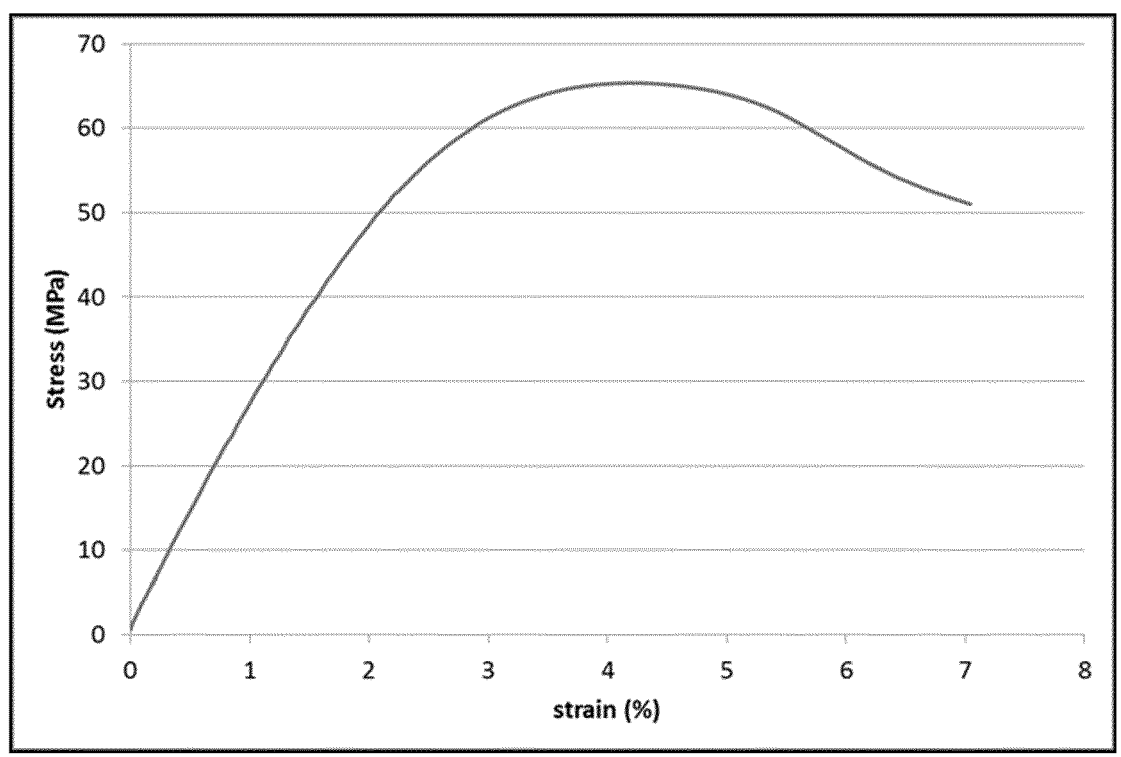
FIG. 1 is a graph of tensile data.

The composition for forming a three-dimensional object via an additive fabrication process comprises at least a first network-forming component. In an embodiment, the composition for forming a three-dimensional object via an additive fabrication process consists of a first network-forming component.

The first network-forming component comprises at least a TPA-based polyester, one or more first network monomers, and a first network initiator. In an embodiment, the first network-forming component consists of at least a TPA-based polyester, one or more first network monomers, and a first network initiator. The TPA-based polyester should be soluble in the one or more first network monomers, such that, when mixed together, the parts of the first network-forming component should be present as a clear liquid.

In an embodiment, the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the total weight of the composition. In an embodiment the first network-forming component is present in an amount of 100 wt % or less, 90 wt % or less, 80 wt % or less, 70 wt % or less, or 60 wt % or less, based on the total weight of the composition.

In an embodiment, the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the total weight of the composition, excluding the weight of any solvent. A solvent is a non-reactive liquid in which the components of the composition are dissolved. Typically, solvents are low molecular weight alcohols or water, depending on the reactive functionality of the composition. In an embodiment the first network-forming component is present in an amount of 100 wt % or less, 90 wt % or less, 80 wt % or less, 70 wt % or less, or 60 wt % or less, based on the total weight of the composition excluding any solvent.

In an embodiment, the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the weight of the composition, excluding the weight of any solvent and the weight of any components that do not comprise a polymerizable group (e.g. a non-reactive particulate filler). In an embodiment the first network-forming component is present in an amount of 100 wt % or less, 90 wt % or less, 80 wt % or less, 70 wt % or less, or 60 wt % or less, based on the total weight of the composition excluding any solvent and any components that do not comprise a polymerizable group.

Optionally, the composition additionally comprises one or more further first network monomers, oligomers, or polymers having a number average of 2 or more polymerizable groups that are able to (co)polymerize with the polymerizable groups of the TPA-based polyester or the one or more first-network monomers.

Optionally, the composition additionally comprises a second network-forming component comprising one or more second network compounds that do not (co)polymerize with the first network-forming component, and a second network initiator for initiating the polymerization of the one or more second network compounds. For example, the first network-forming component may be polymerizable by free-radical polymerization and the second network-forming component may be polymerizable by cationic polymerization.

For purposes of the instant application, a non-limiting list of groups that (co)polymerize or do not (co)polymerize are defined as follows. Acrylate, methacrylate, itaconate, allyl ether, maleate, or fumarate groups (co)polymerize with acrylate, methacrylate, itaconate, vinyl ether, allyl ether, maleate, or fumarate groups, and do not (co)polymerize with hydroxyl, epoxy, and oxetane groups. Hydroxyl, epoxy, and oxetane groups (co)polymerize with hydroxyl, epoxy, oxetane, and vinyl ether groups, and do not (co)polymerize with acrylate, methacrylate, itaconate, allyl ether, maleate, or fumarate groups. Vinyl ether groups (co)polymerize with acrylate, methacrylate, epoxy, oxetane, hydroxyl, itaconate, vinyl ether, allyl ether, maleate, or fumarate groups.

Thus, in the case that the TPA-based polyester comprises a number average of at least 2 acrylate, methacrylate, itaconate, allyl ether, maleate, or fumarate groups per molecule, the one or more first network monomers comprise an acrylate, methacrylate, itaconate, vinyl ether, allyl ether, maleate, or fumarate group and the optional one or more further first network monomers, oligomers or polymers comprises a number average of 2 or more acrylate, methacrylate, itaconate, vinyl ether, allyl ether, maleate, or fumarate groups. In the case that the TPA-based polyester comprises a number average of at least 2 hydroxyl, epoxy, or oxetane groups per molecule, the one or more first network monomers comprise a hydroxyl, epoxy, oxetane, or vinyl ether group and the optional one or more further first network monomers, oligomers or polymers comprises a number average of 2 or more hydroxyl, epoxy, oxetane, or vinyl ether groups. In the case that the TPA-based polyester comprises a number average of at least 2 vinyl ether groups per molecule, the one or more first network monomers comprise an acrylate, methacrylate, itaconate, hydroxyl, epoxy, oxetane, vinyl ether, allyl ether, maleate, or fumarate group and the optional one or more further first network monomers, oligomers or polymers comprises a number average of 2 or more acrylate, methacrylate, itaconate, hydroxyl, epoxy, oxetane, vinyl ether, allyl ether, maleate, or fumarate groups.

In an embodiment, the TPA-based polyester comprises multiple different types of polymerizable groups. In an embodiment, the TPA-based polyester comprises a combination of methacrylate and acrylate groups. In an embodiment, the TPA-based polyester comprises a free-radically polymerizable group and a cationic polymerizable group. In an embodiment, the TPA-based polyester comprises i) at least one polymerizable group selected from acrylate, methacrylate, itaconate, allyl ether, maleate, or fumarate, and ii) at least one polymerizable group selected from hydroxyl, epoxy, or oxetane. In the case where the TPA-based polyester comprises i) at least one polymerizable group selected from acrylate, methacrylate, itaconate, allyl ether, maleate, or fumarate, and ii) at least one polymerizable group selected from hydroxyl, epoxy, or oxetane, the one or more first network monomers comprise an acrylate, methacrylate, itaconate, hydroxyl, epoxy, oxetane, vinyl ether, allyl ether, maleate, or fumarate group and the optional one or more further first network monomers, oligomers or polymers comprises a number average of 2 or more acrylate, methacrylate, itaconate, hydroxyl, epoxy, oxetane, vinyl ether, allyl ether, maleate, or fumarate groups. In an embodiment, the TPA-based polyester comprises i) at least one acrylate or methacrylate group, and ii) at least one epoxy group.

Throughout this patent application, when a polymerizable group is referred to as "epoxy" or "epoxy group," it is intended to encompass, without limitation, epoxy, oxirane, oxiranyl, glycidyl, or cycloaliphatic epoxy groups.

Further optional components are particulate fillers that may or may not be able to (co)polymerize with the first network-forming component.

TPA-Based Polyester Component

The composition for forming a three-dimensional object comprises a TPA-based polyester. The TPA-based polyester comprises a backbone and a number average of at least 2 polymerizable groups per molecule. The backbone comprises the reaction product of a terephthalic acid (TPA) and a polyol.

The backbone comprises a polyester formed from the polycondensation product of terephthalic acid and a polyol. A polyol is an alcohol having two or more hydroxyl groups. In an embodiment, the polyol is a diol, a triol, or a tetraol. In an embodiment, the polyol is a pentaol or higher order polyol. In an embodiment, the polyol is a diol. The TPA-based polyester may comprise just a single type of polyol and TPA, but may also comprise more than one type of polyol, such as two, three, four, five, or six different polyols, and TPA. In an embodiment the TPA-based polyester is linear. In an embodiment, the TPA-based polyester is branched or dendritic.

In an embodiment, the polyol is an aliphatic or cylcoaliphatic polyol. In an embodiment, the polyol is an aromatic polyol. In an embodiment, the polyol has at least 2, at least 3, at least 4, at least 5, or at least 6 hydroxyl groups. In an embodiment, the polyol has at most 2, at most 3, at most 4, at most 5, at most 6, at most 8, or at most 10 hydroxyl groups. In an embodiment, the polyol is linear. In an embodiment, the polyol is branched.

The polyol is selected such that the glass transition temperature (Tg) of the TPA-based polyester is 40° C. or more. In an embodiment, the TPA-based polyester has a Tg of at least 40° C., at least 45° C., at least 50° C., at least 55° C., at least 60° C., at least 65° C., or at least 70° C. In an embodiment, the Tg of the TPA-based polyester is 150° C. or less, 125° C. or less, or 120° C. or less.

In an embodiment, the polyol comprises a polyalkylene polyol or a polyalkylene oxide polyol. In an embodiment, the polyol comprises a polyethylene glycol, a polypropylene glycol, a polytetramethylene oxide (PTMO) polyol, a random or block polypropylene oxide-polyethylene oxide copolymer polyol, a random or block polytetramethylene oxide-polyethylene oxide copolymer polyol, a polycarbonate polyol, a hydroxyl-terminated silicone, a hydroxyalkyl-terminated silicone, a random or block silicone-polyethyleneoxide copolymer polyol, a polybutadiene polyol, a polyisobutylene polyol, a polybutylene oxide polyol, or a mixture thereof.

In an embodiment, the polyol comprises 1,4-butanediol, 1,2-propylene glycol, 1,3-propylene glycol, dipropylene glycol, tripropylene glycol, ethylene glycol, diethylene glycol, triethylene glycol, trimethylene glycol, tetramethylene glycol, pentamethylene glycol, hexamethylene glycol, octamethylene glycol, decamethylene glycol, neopentyl glycol, 1,6-hexanediol, hydrogenated bisphenol-A, ethoxylated bisphenol A, propoxylated bisphenol A, glycerol, 1,2,6-Hexanetriol, 1,1,1-Tris(hydroxymethyl)propane, pentane-1,2,3-triol, propane-1,1,1-triol, 1,2-cyclohexanediol, 1,4-cyclohexanediol, 1,1-cyclohexanedimethylol, cyclohexane-1,2,4-triol, cyclopropane-1,2,3-triol, benzenetriol, pentane-1,1,5,5-tetraol, hexane-1,2,5,6-tetraol, 1,2,4,5-tetrahydroxybenzene, butane-1,2,3,4-tetraol, [1,1'-biphenyl]-3,3',5,5'-tetraol, trimethylolpropane, pentaerythritol, 1,4-cyclohexane dimethanol, phenyldiethanolamine, or a mixture thereof.

In an embodiment, the TPA-based polyester comprises a further polyacid other than TPA. In an embodiment, the further polyacid is an aliphatic polyacid or an aromatic polyacid. In an embodiment, the further polyacid comprises a dicarboxylic acid represented by the general formula HOOC—Z—COOH wherein Z is aliphatic compound contains at least 2 carbon atoms. Such dicarboxylic acids include adipic acid, sebacic acid, phthalic acid, isophthalic acid, octadecanedioic acid, pimelic acid, suberic acid, azelaic acid, brassilic acid, dodecanedioic acid, glutaric acid, maleic acid, fumaric acid, 6-naphthalenedicarboxylic acid, 4,4'-oxybisbenzoic acid, 3,6-dichlorophthalic acid, tetrachlorophthalic acid, tetrahydrophthalic acid, hexahydroterephthalic acid, hexachloroendomethylenetetrahydrophthalic acid, endomethylenetetrahydrophthalic acid, decanedicarboxylic acid, succinic acid, and trimellitic acid. In an embodiment, the further polyacid comprises phthalic acid or isophthalic acid.

In an embodiment, at least 20 mol %, at least 30 mol %, at least 40 mol %, at least 50 mol %, at least 60 mol %, at least 70 mol %, at least 75 mol %, at least 80 mol %, at least 85 mol %, at least 90 mol %, at least 95 mol %, at least 98 mol %, or 100 mol % of the backbone of the TPA-based polyester comprises the reaction product of a polyacid and a polyol. In an embodiment, at most 100 mol %, at most 98 mol %, at most 95 mol %, at most 90 mol %, at most 80 mol %, at most 70 mol %, or at most 60 mol % of the backbone of the TPA-based polyester comprises the reaction product of a polyacid and a polyol.

In an embodiment, at least 20 mol %, at least 30 mol %, at least 40 mol %, at least 50 mol %, at least 60 mol %, at least 70 mol %, at least 75 mol %, at least 80 mol %, at least 85 mol %, at least 90 mol %, at least 95 mol %, at least 98 mol %, or 100 mol % of the backbone of the TPA-based polyester comprises the reaction product of TPA and a polyol. In an embodiment, at most 100 mol %, at most 98 mol %, at most 95 mol %, at most 90 mol %, at most 80 mol %, at most 70 mol %, or at most 60 mol % of the backbone of the TPA-based polyester comprises the reaction product of TPA and a polyol.

The TPA-based polyester comprises polymerizable groups that comprise an acrylate, methacrylate, epoxy, oxetane, hydroxyl, itaconate, vinyl ether, allyl ether, maleate, or fumarate. In an embodiment, the polymerizable groups comprise acrylate, methacrylate, epoxy, oxetane, or itaconate. In an embodiment the polymerizable groups comprise acrylate, methacrylate, epoxy, or oxetane. In an embodiment, the polymerizable groups comprise acrylate or methacrylate. In an embodiment, the polymerizable groups comprise methacrylate. The polymerizable groups can be formed by, for example, reacting a hydroxyl functional monomer comprising the desired polymerizable group with a carboxylic acid functional polymer comprising a TPA/polyol backbone. Another possible way of forming the polymerizable groups is to react an OH group on the polymer with a di or higher order isocyanate, and then reacting a hydroxyl functional monomer comprising the desired polymerizable group with the isocyanate group on the polymer. For example, the hydroxyl functional monomer may be hydroxyethyl methacrylate.

In an embodiment, the polymerizable groups comprise endgroups. An endgroup is a group present at the terminus of a polymer. In an embodiment, the polymerizable groups are endgroups and there are no polymerizable groups that are not endgroups in the TPA-based polyester.

In an embodiment, the TPA-based polyester comprises a number average of 2.0, at least 2.1, at least 2.2, at least 2.3, at least 2.4, at least 2.5, at least 2.6, or at least 2.7 polymerizable groups per molecule. In an embodiment, the TPA-based polyester comprises a number average of at most 10, at most 9, at most 8, at most 7, at most 6, at most 5, at most 4.5, at most 4, at most 3.5, or at most 3 polymerizable groups per molecule. In an embodiment, the TPA-based polyester comprises from 2.3-3 polymerizable groups. Generally, as the functionality of the TPA-based polyester increases, the amount of the TPA-based polyester in the composition may decrease.

In an embodiment, the TPA-based polyester has a number average molecular weight of at least 800 g/mol, at least 900 g/mol, at least 1000 g/mol, at least 1100 g/mol, at least 1200 g/mol, at least 1300 g/mol, at least 1400 g/mol, or at least 1500 g/mol. In an embodiment, the TPA-based polyester has a number average molecular weight of at most 10,000 g/mol, at most 9,000 g/mol, at most 8,000 g/mol, at most 7000 g/mol, at most 6,000 g/mol, at most 5,000 g/mol, at most 4,000 g/mol, or at most 3,000 g/mol.

In an embodiment, the TPA-based polyester has a number average of from 2 to 3 polymerizable groups, and the amount, number average molecular weight, and number average of polymerizable groups of the TPA-based polyester in the composition satisfies the following equation to tune the network density of the cured network:

$$X \text{ MPa} \leq 3*R*T*\left[(3-f)*\left(\frac{\rho * w_{polyester}}{M_{polyester}}\right) + (f-2)*3*\left(\frac{\rho * w_{polyester}}{M_{polyester}}\right)\right] \leq Y \text{ MPa}$$

wherein R is the gas constant 8.314 cm$^3$ MPa K$^{-1}$ mol$^{-1}$, T is 423.15 K, f is the number average of polymerizable groups of the TPA-based polyester, $\rho$ is the density of the TPA-based polyester in g/cm$^3$, $M_{polyester}$ is the number average molecular weight of the TPA-based polyester in g/mol, and $w_{polyester}$ is the weight fraction of the TPA-based polyester in the first network-forming component. In an embodiment, X is 3, 5, 7, 10, 15, or 20. In an embodiment, Y is 50, 45, or 40. In an embodiment, the TPA-based polyester has a number average of from 2 to 3 endgroups, and the amount, number average molecular weight, and number average of endgroups of the TPA-based polyester in the composition satisfies the above equation, and f is the number average of endgroups of the TPA-based polyester.

It is possible that the TPA-based polyester achieves a number average of from 2 to 3 polymerizable groups per molecule by a blend of TPA-based polyesters having different functionalities. For example, using 70 mol % of a TPA-based polyester having a number average of 2.3 polymerizable groups per molecule and 30 mol % of a TPA-based polyester having a number average of 4.0 polymerizable groups per molecule, is considered a TPA-based polyester having a number average of 2.8 polymerizable groups per molecule. In this example, f in the above equation would be 2.8 and $M_{polyester}$ is calculated based on the mol % of each TPA-based polyester.

In an embodiment, the TPA-based polyester is present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition. In an embodiment, the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.

In an embodiment, the TPA-based polyester is present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent. In an embodiment, the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.

In an embodiment, the TPA-based polyester is present in an amount of 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the first network-forming component. In an embodiment, the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the first network-forming component.

In an embodiment, the TPA-based polyester is amorphous. In an embodiment, the TPA-based polyester comprises a blend of amorphous and semi-crystalline TPA-based polyesters. In an embodiment, the TPA-based polyester comprises a blend of amorphous, semi-crystalline, and crystalline TPA-based polyesters.

First Network Monomer and First Network Initiator

In addition to the TPA-based polyester, the composition for forming a three-dimensional object via an additive fabrication process comprises one or more first network monomers and a first network initiator. Depending on the polymerizable group(s) of the TPA-based polyester, the first network monomer and optional one or more further first network monomers, oligomers, or polymers may be free radically polymerizable compounds or cationically polymerizable compounds, and the first network initiator may be a free-radical initiator or a cationic initiator. In an embodiment, the TPA-based polyester comprises a polymerizable group comprising acrylate, methacrylate, itaconate, allyl ether, maleate, or fumarate and the first network monomer and optional one or more further first network monomers, oligomers, or polymers are free radically polymerizable compounds and the first network initiator is a free-radical initiator. In an embodiment, the TPA-based polyester comprises a polymerizable group comprising hydroxyl, epoxy, or oxetane and the first network monomer and optional one or more further first network monomers, oligomers, or polymers are cationically polymerizable compounds and the first network initiator is a cationic initiator.

In an embodiment, the TPA-based polyester comprises a number average of at least 2 acrylate, methacrylate, itaconate, allyl ether, or fumarate groups per molecule, the one or more first network monomers comprise an acrylate, methacrylate, itaconate, vinyl ether, allyl ether, maleate, or fumarate group and the optional one or more further first network monomers, oligomers or polymers comprises a number average of 2 or more acrylate, methacrylate, itaconate, vinyl ether, allyl ether, maleate, or fumarate groups. In an embodiment, the TPA-based polyester comprises a number average of at least 2 hydroxyl, epoxy, or oxetane groups per molecule, the one or more first network monomers comprise a hydroxyl, epoxy, oxetane, or vinyl ether group and the optional one or more further first network monomers, oligomers or polymers comprises a number average of 2 or more hydroxyl, epoxy, oxetane, or vinyl ether groups.

In an embodiment, the TPA-based polyester comprises a number average of at least 2 vinyl ether groups per molecule, the one or more first network monomers comprise an acrylate, methacrylate, itaconate, hydroxyl, epoxy, oxetane, vinyl ether, allyl ether, maleate, or fumarate group and the optional one or more further first network monomers, oligomers or polymers comprises a number average of 2 or more acrylate, methacrylate, itaconate, hydroxyl, epoxy, oxetane, vinyl ether, allyl ether, maleate, or fumarate groups.

The polymerizable groups of the first network monomer are able to (co)polymerize with the polymerizable groups of the TPA-based polyester. The first network monomer has a number average of 0.95 to 1.1 polymerizable groups. In an embodiment the first network monomer has a number average of 0.95 polymerizable groups or more, 0.97 polymerizable groups or more, or 0.99 polymerizable groups or more. In an embodiment the first network monomer has a number average of 1.1 polymerizable groups or less, 1.08 polymerizable groups or less, 1.06 polymerizable groups or less, 1.04 polymerizable groups or less, or 1.02 polymerizable groups or less. In an embodiment, the first network monomer has a number average of 1.0 polymerizable groups.

A linear polymer formed from the one or more first network monomers has a Tg of 40° C. or more. In an embodiment, a linear polymer formed from the one or more first network monomers has a Tg of 50° C. or more, 60° C. or more, 65° C. or more, 70° C. or more, 75° C. or more, 80° C. or more, 85° C. or more, 90° C. or more, 95° C. or more, or 100° C. or more. In an embodiment, a linear polymer formed from the one or more first network monomers has a Tg of 150° C. or less, 130° C. or less, 125° C. or less, or 120° C. or less. It is possible that multiple first network monomers with different molecular formulas are present in the one or more first network monomers, some with a Tg of above the claimed amount and some with a Tg of below the claimed amount. A linear polymer is formed from all of the first network monomers together and the Tg of the linear polymer is measured to determine if the Tg is within the claimed range.

In an embodiment, the one or more first network monomers has a molecular weight of 800 g/mol or less, 700 g/mol or less, 600 g/mol or less, 500 g/mol or less, 400 g/mol or less, 350 g/mol or less, 300 g/mol or less, 250 g/mol or less, or 200 g/mol or less. In an embodiment the one or more first network monomers has a molecular weight of 100 g/mol or more, or 150 g/mol or more.

In an embodiment, the TPA-based polyester comprises a polymerizable group comprising acrylate, methacrylate, itaconate, vinyl ether, allyl ether, maleate, or fumarate and the first network monomer comprises methyl (meth)acrylate, hydroxy ethyl (meth)acrylate, ethyl (meth)acrylate, propyl (meth)acrylate, isopropyl (meth)acrylate, isobutyl (meth)acrylate, t-butyl (meth)acrylate, hydroxy propyl (meth)acrylate, cyclohexyl (meth)acrylate, benzyl (meth)acrylate, phenyl (meth)acrylate, isobornyl (meth)acrylate, isobutyl (meth)acrylate, acryloyl morpholine, dimethyl itaconate, N-vinyl pyrollidone, N-vinyl caprolactam, N-vinyl imidazole, or N-methyl-N-vinylacetamide. In an embodiment, the TPA-based polyester comprises a polymerizable group comprising acrylate, methacrylate, itaconate, vinyl ether, allyl ether, maleate, or fumarate and the first network monomer comprises cyclohexyl vinyl ether, 1,4,-cyclohexanedimethanol mono vinyl ether, tert-Butyl vinyl ether, phenyl vinyl ether, allyl phenyl ether, dimethyl maleate, diethyl maleate, dimethyl fumarate, or diethyl fumarate.

In an embodiment, the TPA-based polyester comprises a polymerizable group comprising hydroxyl, epoxy, oxetane, or vinyl ether and the one or more first network monomers comprise cyclohexene oxide, tert-butyl glycidyl ether, 4-chlorophenyl glycidyl ether, cyclopentene oxide,exo-2,3-Epoxynorbornane, 1,2-Epoxy-3-phenoxypropane, (2,3-Epoxypropyl)benzene, N-(2,3-Epoxypropyl)phthalimide, exo-3,6-Epoxy-1,2,3,6-tetrahydrophthalic anhydride, 3,4-Epoxytetrahydrothiophene-1,1-dioxide, Furfuryl glycidyl ether, glycidyl 4-methoxyphenyl ether, glycidyl 2-methylphenyl ether, isophorone oxide, α-Pinene oxide, cis-stilbene oxide, styrene oxide, Methyl,Methyl 7-oxabicyclo [4.1.0]heptane-3-carboxylate, 2-Ethylhexyl 7-oxabicyclo (4.1.0)heptane-3-carboxylatecarboxylate, 3-ethyl-3-hydroxymethyloxetane, 3-ethyl-3-(3-hydroxypropyl) oxymethyloxetane, 3-ethyl-3-(4-hydroxybutyl) oxymethyloxetane, cyclohexyl vinyl ether, 1,4,-cyclohexanedimethanol mono vinyl ether, tert-Butyl vinyl ether, or phenyl vinyl ether.

In an embodiment, the one or more first network monomers are present in an amount of at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition. In an embodiment, the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.

In an embodiment, the one or more first network monomers are present in an amount of at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent. In an embodiment, the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.

In an embodiment, the one or more first network monomers are present in an amount of at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the first network-forming component. In an embodiment, the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the first network-forming component.

The first network initiator serves to initiate polymerization of the TPA-based polyester, the one or more first network monomers, optionally, the one or more further first network monomers, oligomers, or polymers, and, optionally, the particulate filler comprising a polymerizable group that is able to (co)polymerize with the polymerizable groups of the TPA-based polyester. In an embodiment, the one or more first network initiators comprise a photo-initiator or a thermal initiator. In an embodiment, the one or more first network initiators comprise a photo-initiator that initiates polymerization in response to UV light, visible light, or both UV light and visible light. In an embodiment, the one or more first network initiators comprise a photo-initiator that initiates polymerization at a wavelength of from 300 to 470 nm. In an embodiment, the one or more first network initiators comprise a photo-initiator that initiates polymerization at a wavelength of from 300 to 395 nm. In an embodiment, the one or more first network initiators comprise a photo-initiator and a thermal initiator.

In an embodiment, the one or more first network initiators comprise a thermal initiator. The thermal initiator may be used to further cure the composition during a thermal post-treatment of an article formed from the composition.

In an embodiment, the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition. In an embodiment, the one or more first network monomers are present in an amount of at most 10 wt %, at most 8 wt %, at most 7 wt %, at most 6 wt %, at most 5 wt %, or at most 4 wt %, based on the total weight of the composition.

In an embodiment, the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition excluding any solvent. In an embodiment, the one or more first network monomers are present in an amount of at most 10 wt %, at most 8 wt %, at most 7 wt %, at most 6 wt %, at most 5 wt %, or at most 4 wt %, based on the total weight of the composition excluding any solvent.

In an embodiment, the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the first network-forming component. In an embodiment, the one or more first network initiators are present in an amount of at most 10 wt %, at most 8 wt %, at most 7 wt %, at most 6 wt %, at most 5 wt %, or at most 4 wt %, based on the total weight of the first network-forming component.

Further First Network Monomer, Oligomer, or Polymer

Optionally, the composition comprises one or more further first network monomers, oligomers, or polymers having a number average of 2 or more polymerizable groups that are able to (co)polymerize with the polymerizable groups of the TPA-based polyester or the one or more first-network monomers.

In an embodiment, the one or more further first network monomers, oligomers, or polymers is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the composition. In an embodiment, the one or more further first network monomers, oligomers, or polymers is present in an amount of at least 0.5 wt %, at least 1 wt %, at least 1.5 wt %, at least 2 wt %, at least 2.5 wt %, at least 4 wt %, or at least 5 wt %, based on the total weight of the composition.

In an embodiment, the one or more further first network monomers, oligomers, or polymers is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the composition excluding any solvent. In an embodiment, the one or more further first network monomers, oligomers, or polymers is present in an amount of at least 0.5 wt %, at least 1 wt %, at least 1.5 wt %, at least 2 wt %, at least 2.5 wt %, at least 4 wt %, or at least 5 wt %, based on the total weight of the composition excluding any solvent.

In an embodiment, the one or more further first network monomers, oligomers, or polymers is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the first network-forming component. In an embodiment, the one or more further first network monomers, oligomers, or polymers is present in an amount of at least 0.5 wt %, at least 1 wt %, at least 1.5 wt %, at least 2 wt %, at least 2.5 wt %, at least 4 wt %, or at least 5 wt %, based on the total weight of the first network-forming component.

Optional Second Network-Forming Component

Optionally, the composition comprises a second network-forming component. The second network-forming component comprises one or more second network compounds comprising polymerizable groups that do not (co)polymerize with the polymerizable groups of the TPA-based polyester, and a second network initiator for initiating the polymerization of the one or more second network compounds. In an embodiment, the TPA-based polyester comprises polymerizable groups comprising acrylate, methacrylate, or itaconate, and the one or more second network compounds comprises polymerizable groups that comprise epoxy, oxetane, or hydroxyl.

In an embodiment, the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition. In an embodiment the second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition. In an embodiment, the composition is devoid of second network-forming component. In an embodiment, the composition is substantially devoid of second network-forming component.

In an embodiment, the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition, excluding the weight of any solvent. In an embodiment the second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition excluding any solvent.

In an embodiment, the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition excluding any solvent and any components that do not comprise a polymerizable group. In an embodiment the second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition excluding any solvent and any components that do not comprise a polymerizable group.

In an embodiment, the one or more second network compounds are present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition. In an embodiment, the one or more second network compounds are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.

In an embodiment, the one or more second network compounds are present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent. In an embodiment, the one or more second network compounds are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.

In an embodiment, the one or more second network compounds are present in an amount of at least 50 wt %, at least 60 wt %, at least 70 wt %, at least 80 wt %, or at least 90 wt %, based on the total weight of the second network-forming component. In an embodiment, the one or more second network compounds are present in an amount of at most 99.9 wt %, at most 99.5 wt %, at most 99 wt %, at most 98 wt %, at most 97 wt %, at most 96 wt %, at most 95 wt %, at most 90 wt %, or at most 80 wt %, based on the total weight of the second network-forming component.

In an embodiment, the second network initiator comprises a photo-initiator or a thermal initiator. In an embodiment, the second network initiator comprises a photo-initiator that initiates polymerization in response to UV light, visible light, or both UV light and visible light. In an embodiment, the second network initiator comprises a photo-initiator and a thermal initiator.

In an embodiment, the second network initiator is present in an amount at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition excluding any solvent. In an embodiment, the second network initiator is present in an amount of at most 10 wt %, at most 8 wt %, at most 7 wt %, at most 6 wt %, at most 5 wt %, or at most 4 wt %, based on the total weight of the composition excluding any solvent.

In an embodiment, the second network initiator is present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the second network-forming component. In an embodiment, the second network initiator is present in an amount of at most 10 wt %, at most 8 wt %, at most 7 wt %, at most 6 wt %, at most 5 wt %, or at most 4 wt %, based on the total weight of the second network-forming component.

Various components comprising polymerizable groups may be present in the composition. Below, various free radically polymerizable compounds and cationically polymerizable compounds are described. Depending on the polymerizable groups of the TPA-based polyester and the number average of polymerizable groups of the compounds, these compounds may be first network monomers, further first network monomers, oligomers or polymers, or second network compounds comprising polymerizable groups.

Free Radically Polymerizable Compounds

In an embodiment, the first network-forming component or second network-forming component comprises at least one free radically polymerizable compound, that is, a component which undergoes polymerization initiated by free radicals. Free radically polymerizable compounds are monomers, oligomers, and/or polymers; they are monofunctional or polyfunctional materials, i.e., have 1, 2, 3, 4, 5, 6, 7, 8, 9, 10, 20, 30, 40, 50, 100, or more functional groups that can polymerize by free radical initiation, may contain aliphatic, aromatic, cycloaliphatic, arylaliphatic, each of which may comprise one or more heteroatoms, or any combination thereof.

In accordance with an embodiment, the first network-forming component or second network-forming component comprises a component comprising at least one polymerizable (meth)acrylate group. Examples of components comprising at least one polymerizable (meth)acrylate group include acrylates and methacrylates such as isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth)acrylate, undecyl (meth)acrylate, lauryl (meth)acrylate, tetradecyl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, 2-(2-ethoxyethoxy)ethyl acrylate, acetoacetoxy (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate, 2-(phenylthio)ethyl acrylate, and nonyl phenol acrylate.

Examples of components comprising more than one (meth)acrylate group include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro[5.5]undecane di(meth)acrylate; dipentaerythritol monohydroxypenta(meth)acrylate, propoxylated trimethylolpropane tri(meth)acrylate, ethoxylated trimethylolpropane tri(meth)acrylate, propoxylated neopentyl glycol di(meth) acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri(meth)acrylate, tris(2-hydroxyethyl)isocyanurate di(meth)acrylate, pentaerythritol tri(meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the first network-forming component or second network-forming component comprises all methacrylate groups, all acrylate groups, or any combination of methacrylate and acrylate groups.

In an embodiment, the free radically polymerizable compound comprises bisphenol A diglycidyl ether di(meth)acrylate, ethoxylated or propoxylated bisphenol A or bisphenol F di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate, di pentaerythritol monohydroxypenta(meth)acrylate, dipentaerythritol hexa(meth)crylate, propoxylated trimethylolpropane tri(meth)acrylate, or propoxylated neopentyl glycol di(meth)acrylate, or any combination thereof.

In an embodiment, the free radically polymerizable compound comprises an ester formed from itaconic acid, citraconic acid, or mesaconic acid. In an embodiment, the free radically polymerizable compound is dimethyl itaconate.

In an embodiment, the free radically polymerizable compound comprises a thiol-containing compound. In an embodiment, the free radically polymerizable compound comprises an aliphatic thiol, more preferably a primary aliphatic thiol. In an embodiment, the free radically polymerizable compound comprises an aromatic thiol. In an embodiment, the thiol-containing compound comprises an aliphatic thiol and comprises an α-mercapto acetate or β-mercapto propionate, or a derivative or mixture thereof. In an embodiment, the thiol-containing compound comprises dodecyl mercaptan or octyl mercaptan, In an embodiment, the free radically polymerizable compound comprises a dithioester, a thioether, a thione, a trithiocarbonate, such as dibenzyltrithiocarbonate, a dithiocarbamate, a xanthate, such as O-ethyl-S-(1-methoxycarbonyl)ethyl dithiocarbonate [RSC(=S)—OC$_2$H$_5$ where R is —CH(CH$_3$)—C(=O)—OCH$_3$], or a mixture thereof.

Cationically Polymerizable Compounds

In an embodiment, the first network-forming component or second network-forming component comprises at least one cationically polymerizable compound, that is, a compound which undergoes cationic polymerization. The cationically polymerizable compound may be selected from the group consisting of cyclic ether compounds, cyclic acetal compounds, cyclic thioethers compounds, spiro-orthoester compounds, cyclic lactone compounds, and vinyl ether compounds, and any combination thereof. Of the cationically polymerizable groups that may be present in the composition, cycloaliphatic epoxy and oxetane groups generally have the fastest reactivity and are thus preferred for that reason.

Examples of cationically polymerizable compounds include cyclic ether compounds such as epoxy compounds, oxetane compounds, cyclic lactone compounds, cyclic acetal compounds, cyclic thioether compounds, spiro orthoester compounds, and vinylether compounds. Specific examples of cationically polymerizable compounds include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl) ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, polyglycidyl ethers of polyether polyol obtained by the addition of one or more alkylene oxides to aliphatic polyhydric alcohols such as ethylene glycol, propylene glycol, and glycerol, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, (3-ethyl-3-oxetanylmethoxy)methyl benzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene (3-ethyl-3- oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, and any combination thereof.

Examples of polyfunctional materials that are cationically polymerizable include dendritic polymers such as dendrimers, linear dendritic polymers, dendrigraft polymers, hyperbranched polymers, star branched polymers, and hypergraft polymers with epoxy, oxetane, or hydroxyl functional groups. The dendritic polymers may contain one type of polymerizable functional group or different types of polymerizable functional groups, for example, epoxy and oxetane functions.

In an embodiment, the cationically polymerizable compound comprises a hydroxyl functional component comprising at least one primary OH group. In an embodiment, the cationically polymerizable compound comprises a hydroxyl functional component comprising two primary OH groups.

In an embodiment, the cationically polymerizable compound comprises a diol of number average molecular weight less than about 500 g/mol. In an embodiment, the cationically polymerizable compound comprises a diol of number average molecular weight less than about 400 g/mol. In an embodiment, the cationically polymerizable compound comprises ethylene glycol, 1,2-propanediol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, diethylene glycol, triethyleneglycol, tetraethylene glycol, dipropylene glycol or tripropylene glycol. In an embodiment, the cationically polymerizable compound comprises a polyol with three or more OH groups, such as trimethylolpropane, glycerol, or pentaerythritol.

In an embodiment, the cationically polymerizable component comprises an alkoxylated polyol, such as ethoxylated or propoxylated versions of the polyols in the previous paragraph. However, alkoxylated polyols may have the effect of lowering the Tg of an article produced by polymerizing the composition, and should therefore be used with care. In an embodiment, the cationically polymerizable component comprises an alkoxylated aromatic diol. In an embodiment, the cationically polymerizable compound comprises a bisphenol A with ethoxylations and/or propoxylations. This bisphenol A may for example contain in total between about 1 and about 30 ethoxylations and/or propoxylations per hydroxyl group.

In an embodiment, the cationically polymerizable component comprises poly(propylene glycol) or copolymers thereof, poly(ethylene glycol) or copolymers thereof, poly (teramethylene oxide) or copolymers thereof, poly(butylene oxide) or copolymers thereof, hydroxyl-terminated poly (butadiene), poly(caprolactone) diols, poly(caprolactam)diols hydroxyl-terminated poly(acrylate), hydroxyl-terminated poly(ester), poly(carbonate) telechelic diols, poly (ether) telechelic diols, poly(urethane) telechelic diols, hydroxyl-terminated poly(dimethyl siloxane) and copolymers thereof.

Various types of initiators may be present in the composition. Below, various free radical initiators and cationic initiators are described. Depending on the polymerizable groups of the TPA-based polyester, these initiators may be first network initiators or second network initiators.

Polymerization may be initiated by any suitable way, depending on the necessary initiation mechanism for the initiators. In an embodiment, polymerization is initiated via irradiation of the composition with light or heat. Preferably, the polymerizable composition is polymerized by applying UV or visible light. The radiation may be provided by a lamp, laser, LED, or other light sources.

Free-Radical Polymerization Initiator

In the case that the first network-forming component or second network-forming component comprises a free radically polymerizable compound, the respective first network-forming component or second network-forming component also comprises a free-radical polymerization initiator. Preferred examples of free-radical polymerization initiators are thermal initiators and photo-initiators. Preferably, the free-radical polymerization initiator comprises a free-radical photo-initiator.

In accordance with an embodiment, the first network-forming component or second network-forming component comprises at least one free-radical photo-initiator. In an embodiment, the free-radical photo-initiator is selected from the group consisting of benzoylphosphine oxides, aryl ketones, benzophenones, hydroxylated ketones, I-hydroxyphenyl ketones, ketals, metallocenes, and any combination thereof.

In an embodiment, the first network-forming component or second network-forming component includes at least one free-radical photo-initiator selected from the group consisting of 2,4,6-trimethylbenzoyl diphenylphosphine oxide and 2,4,6-trimethylbenzoyl phenyl, ethoxy phosphine oxide, bis (2,4,6-trimethylbenzoyl)-phenylphosphineoxide, 2-methyl-1-[4-(methylthio)phenyl]-2-morpholinopropanone-1, 2-benzyl-2-(dimethylamino)-1-[4-(4-morpholinyl) phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino) benzophenone, and 4,4'-bis(N,N'-dimethylamino) benzophenone (Michler's ketone), benzophenone, 4-methyl benzophenone, 2,4,6-trimethyl benzophenone, dimethoxybenzophenone, I-hydroxycyclohexyl phenyl ketone, phenyl (1-hydroxyisopropyl)ketone, 2-hydroxy-1-[4-(2-hydroxyethoxy) phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino) benzophenone, benzil dimethyl ketal, bis (eta 5-2-4-cyclopentadien-1-yl) bis[2,6-difluoro-3-(1H-pyrrol-1-yl) phenyl] titanium, and any combination thereof.

Further free-radical photo-initiators include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), 4,4'-bis(N,N'-dimethylamino) benzophenone (Michler's ketone), camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide (Irgacure 819 or BAPO from Ciba), and metallocenes such as bis (eta 5-2-4-cyclopentadien-1-yl) bis [2,6-difluoro-3-(1H-pyrrol-1-yl) phenyl] titanium (Irgacure 784 from Ciba), or a mixture thereof.

Examples of thermal free-radical polymerization initiators include, but are not limited to, azo compounds such as, for example, azo isobutyronitrile (AIBN), 1,1'-azobis(cyclohexanenitrile), 1,1'-azobis(2,4,4-trimethylpentane), C—C labile compounds, such as benzopinacole, peroxides, and mixtures thereof.

In an embodiment, the free-radical polymerization comprises a peroxide. Possibly suitable peroxides include organic and inorganic peroxides. In an embodiment, the thermal initiator is soluble in the composition.

Examples of peroxides include for example, percarbonates (of the formula —OC(O)O—), peroxyesters (of the formula —C(O)OO—), diacylperoxides, also known as peranhydride (of the formula —C(O)OOC(O)—), dialkylperoxides or perethers (of the formula —OO—), hydroperoxides (of the formula —OOH), etc. The peroxides may also be oligomeric or polymeric in nature.

The thermal free-radical polymerization initiator may for example comprise a percarbonate, a perester or a peranhydride. Peranhydrides are for example benzoylperoxide (BPO) and lauroyl peroxide (commercially available as Laurox™) Peresters are for instance t-butyl per benzoate and 2-ethylhexyl perlaurate. Percarbonates are for example di-t-butylpercarbonate and di-2-ethylhexylpercarbonate or monopercarbonates.

In an embodiment, the thermal free-radical polymerization initiator is an organic peroxide. Examples of organic peroxides are: tertiary alkyl hydroperoxides (such as, for instance, t-butyl hydroperoxide), other hydroperoxides (such as, for instance, cumene hydroperoxide), a ketone peroxide (perketones, being an addition product of hydrogen peroxide and a ketone, such as, for instance, methyl ethyl ketone peroxide, methyl isobutylketone peroxide and acetylacetone peroxide), peroxyesters or peracids (such as, for instance, t-butyl peresters, benzoyl peroxide, peracetates and perbenzoates, lauroyl peroxide, including (di)peroxyesters, perethers (such as, for instance, peroxy diethyl ether).

In an embodiment, the thermal free-radical polymerization initiator comprises a peranhydride, for example benzoyl peroxide or lauroyl peroxide, peroxydicarbonate, for example di(4-t-butylcyclohexyl)-peroxydicarbonate, dicetyl peroxydicarbonate, or dimyristylperoxydicarbonate.

Cationic Polymerization Initiator

In the case that the first network-forming component or second network-forming component comprises a free radically polymerizable compound, the respective first network-forming component or second network-forming component also comprises a cationic polymerization initiator. Preferred examples of cationic polymerization initiators are thermal initiators and photo-initiators. Preferably, the cationic polymerization initiator is a catonic photo-initiator. The cationic photo-initiator initiates cationic ring-opening polymerization upon irradiation with light.

In an embodiment, the cationic photo-initiator comprises a cation of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, ferrocenes, di(cyclopentadienyliron)arene salt compounds, and pyridinium salts, or any combination thereof.

In another embodiment, the cation of the cationic photo-initiator is selected from the group consisting of aromatic diazonium salts, aromatic sulfonium salts, aromatic iodonium salts, metallocene based compounds, aromatic phosphonium salts, polymeric sulfonium salts, naphthyl-sulfonium salts, and any combination thereof. In an embodiment, the cationic photo-initiator is selected from the group consisting of triarylsulfonium salts, diaryliodonium salts, and metallocene based compounds, and any combination thereof.

In an embodiment, the cationic photo-initiator has an anion selected from the group consisting of $BF_4^-$, $AsF_6^-$, $SbF_6^-$, $PF_6^-$, $[B(CF_3)_4]^-$, $B(C_6F_5)_4^-$, $B[C_6H_3\text{-}3,5(CF_3)_2]_4^-$, $B(C_6H_4CF_3)_4^-$, $B(C_6H_3F_2)_4^-$, $B[C_6F_4\text{-}4(CF_3)]_4^-$, $Ga(C_6F_5)_4^-$, $[(C_6F_5)_3B\text{—}C_3H_3N_2\text{—}B(C_6F_5)_3]^-$, $[(C_6F_5)_3B\text{—}NH_2\text{—}B(C_6P_5)_3]^-$, tetrakis(3,5-difluoro-4-alkyloxyphenyl)borate, tetrakis(2,3,5,6-tetrafluoro-4-alkyloxyphenyl)borate, perfluoroalkylsulfonates, tris[(perfluoroalkyl)sulfonyl]methides, bis[(perfluoroalkyl)sulfonyl]imides, perfluoroalkylphosphates, tris(perfluoroalkyl)trifluorophosphates, bis(perfluoroalkyl)tetrafluorophosphates, tris(pentafluoroethyl)trifluorophosphates, and $(CH_6B_{11}Br_6)^-$, $(CH_6B_{11}Cl_6)^-$ and other halogenated carborane anions.

In an embodiment, the cationic photo-initiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis(3,5-difluoro-4-methoxyphenyl)borate, perfluoroalkylsulfonates, perfluoroalkylphosphates, tris[(perfluoroalkyl)sulfonyl]methides, and $[(C_2F_5)_3PF_3]^-$.

Examples of cationic photo-initiators useful for curing at 300-475 nm without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, 4-[4-(3-chlorobenzoyl)phenylthio]phenylbis(4-fluorophenyl)sulfonium tetrakis(3,5-difluoro-4-methyloxyphenyl)borate, 4-[4-(3-chlorobenzoyl)phenylthio]phenylbis(4-fluorophenyl)sulfonium tetrakis(2,3,5,6-tetrafluoro-4-methyloxyphenyl)borate, tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), tris(4-(4-acetylphenyl)thiophenyl)sulfonium hexafluorophosphate (Irgacure® 270 from BASF), and HS-1 available from San-Apro Ltd.

Preferred cationic photo-initiators include, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), and tris(4-(4-acetylphenyl)thiophenyl)sulfonium hexafluorophosphate (Irgacure® 270 from BASF), [4-(1-methylethyl)phenyl](4-methylphenyl) iodonium tetrakis(pentafluorophenyl)borate (available as Rhodorsil 2074 from Rhodia), 4-[4-(2-chlorobenzoyl)phenylthio]phenylbis(4-fluorophenyl)sulfonium hexafluoroantimonate (as SP-172 from Adeka), SP-300 from Adeka, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

Optional Particulate Filler

In certain embodiments, the composition comprises a particulate filler. Examples of particulate fillers include both organic and inorganic particulate fillers. The particulate filler may possess a surface functionality or not, the surface functionality comprising a polymerization group that is capable of (co)polymerization with the first network-forming component or second network-forming component. The particulate filler may be micro or nano-particles comprising organic particles, such as core-shell particles, inorganic particles, pigments, or plasticizers. In an embodiment, the particulate filler comprises an inorganic filler, such as $SiO_2$, $AlO_2$, $TiO_2$, $ZnO_2$, $SnO_2$, Am—$SnO_2$, $ZrO_2$, Sb—$SnO_2$, $Al_2O_3$, or carbon black. In an embodiment, the particulate filler comprises an organic filler, such as polyurethane particles, polystyrene particles, poly(methyl methacrylate) particles, polycarbonate particles, or core-shell particles.

In an embodiment, the particulate filler comprises a polymerizable group that is able to (co)polymerize with the polymerizable groups of the TPA-based polyester. In an embodiment, the particulate filler comprises a polymerizable group that is able to (co)polymerize with the polymerizable groups of the one or more second network compounds. In an embodiment, the particulate filler comprises a polymerizable group comprising acrylate, methacrylate, epoxy, oxetane, hydroxyl, itaconate, vinyl ether, allyl ether, maleate, or fumarate. In an embodiment, the particulate filler comprises a polymerizable group comprising acrylate, methacrylate, epoxy, oxetane, hydroxyl, or itaconate. In an embodiment, the particulate filler comprises a polymerizable group comprising acrylate or methacrylate. In an embodiment, the particulate filler comprises a polymerizable group comprising epoxy, oxetane or hydroxyl.

In an embodiment, the particulate filler comprises an impact modifier. Examples of impact modifiers are elastomer particles. In an embodiment, the impact modifying components, which can be dispersed into the composition, are elastomers based on copolymers of ethylene or propylene and one or more $C_2$ to $C_{12}$ α-olefin monomers.

Examples of such are ethylene/propylene copolymers or ethylene/propylene copolymers, optionally containing a third copolymerizable diene monomer (EPDM), such as 1,4-hexadiene, dicyclopentadiene, di-cyclooctadiene, methylene norbornene, ethylidene norbornene and tetrahydroindene; ethylene/α-olefin copolymers, such as ethylene-octene copolymers and ethylene/α-olefin/polyene copolymers.

In an embodiment, the particulate filler comprises polybutadiene, polyisoprene, styrene/butadiene random copolymer, styrene/isoprene random copolymer, acrylic rubbers (e.g. polybutylacrylate), poly(hexamethylene carbonate).

Elastomer particles may be prepared by a variety of means, including by isolation from a latex made via emulsion polymerization. The average size of these elastomer particles is preferably between about 10 nm and about 10 μm. In an embodiment, the average size of the elastomer particles if from 10 nm to 1 μm.

Optionally, the elastomer may be modified to contain reactive groups that (co)polymerize with the first or second network-forming component. This modification can be introduced by reactive grafting or by copolymerization. Commercial examples of the latter are Lotader random ethylene/acrylate copolymers AX8840 (glycidyl methacrylate/GMA modified), AX8900 and AX8930 (GMA and maleic anhydride modified/MA) produced by Arkema.

Optionally, a shell may be present on the particles that can be introduced, e.g., via grafting or during a second stage of emulsion polymerization. Examples of such particles are core-shell impact modifier particles that contain a rubber core and a glassy shell. Examples of core materials are polybutadiene, polyisoprene, acrylic rubber (e.g. polybutylacrylate rubber), styrene/butadiene random copolymer, styrene/isoprene random copolymer, or polysiloxane. Examples of shell materials or graft copolymers are (co)polymers of vinyl aromatic compounds (e.g. styrene) and vinyl cyanides (e.g. acrylonitrile) or (meth)acrylates (e.g. MMA).

Optionally, polymerizable groups can be incorporated into the shell by copolymerization, such as copolymerization with glycidyl methacrylate, or by treatment of the shell to form reactive functional groups.

Commercially available products of these core-shell type elastomer particles are Resinous Bond RKB (dispersions of core-shell particles in epoxy manufactured by Resinous Chemical Industries Co., Ltd.), Durastrength D400, Durastrength 400R (manufactured by Arkema Group), Paraloid EXL-2300 (non-functional shell), Paraloid EXL-2314 (epoxy functional shell), Paraloid EXL-2600, Paraloid EXL-3387 and Paraloid KM-365 (manufactured by Dow), Genioperl P53, Genioperl P23, Genioperl P22 (manufactured by Wacker Chemical), Kane Ace MX products (manufactured by Kaneka), and the like.

Other examples of such elastomer particles are cross-linked polyorganosiloxane rubbers that may include dialkylsiloxane repeating units, where "alkyl" is $C_1$-$C_6$ alkyl. The particles may be modified to include reactive groups, preferably on the surface of the particles.

Examples of polyorganosiloxane elastomer particles that are commercially available are Albidur EP 2240(A), Albidur EP 2640, Albidur VE 3320, Albidur EP 5340, Albidur EP 5640, and Albiflex 296 (dispersions of particles in epoxy or vinyl ether resins, Hanse Chemie, Germany), Genioperl M41C (dispersion in epoxy, Wacker Chemical), Chemisnow MX Series and MP Series (Soken Chemical and Engineering Co.).

In an embodiment, two different diameters of impact modifiers are used in a certain ratio. In an embodiment, the composition of impact modifiers is about a 7 to 1 ratio of diameter (e.g. 140 nm particles vs. a 20 nm particles) and about a 4 to 1 ratio of wt %. In another embodiment, the composition of impact modifiers is about a 5 to 1 ratio of diameter and about a 4 to 1 ratio of wt %. In another embodiment the composition of impact modifiers is about a 5 to 1 ratio of diameter and about a 6 to 1 ratio of wt %.

In an embodiment, the particulate filler is present in the composition in an amount of 1 wt % or more, 5 wt % or more, 10 wt % or more, 15 wt % or more, 20 wt % or more, 30 wt % or more, 40 wt % or more, or 50 wt % or more, based on the total weight of the composition. In an embodiment, the particulate filler is present in the composition in an amount of 90 wt % or less, 80 wt % or less, 70 wt % or less, 60 wt % or less, 50 wt % or less, 40 wt % or less, 30 wt % or less, or 20 wt % or less, based on the total weight of the composition.

Further Optional Components

Additional components that may be present in the composition include stabilizers, such as viscosity stabilizers or light stabilizers, UV absorbers, dyes, pigments, plasticizers, surfactants, antioxidants, wetting agents, photosensitizers, defoamers, flame retardants, silane coupling agents, acid scavengers, accelerators for a thermal initiator, and/or bubble breakers.

In an embodiment, the polymerizable composition comprises a non-particulate impact modifier. In an embodiment, the non-particulate impact modifier comprises a block copolymer that is soluble in the composition or dispersed as micelles. In an embodiment, the block copolymer comprises ethylene/acrylate random copolymers and acrylic block copolymers, styrene/butadiene/(meth)acrylate (SBM) block-copolymers, styrene/butadiene block copolymer (styrene-butadiene-styrene block copolymer (SBS), styrene-isoprene-styrene block copolymer (SIS) and their hydrogenated versions, SEBS, SEPS), and (SIS) and ionomers.

Examples of commercial block copolymers are Kraton (SBS, SEBS, SIS, SEBS and SEPS) block copolymers produced by Shell, Nanostrength block copolymers E20, E40 (SBM type) and M22 (full-acrylic) as produced by Arkema, Lotryl ethyl/acrylate random copolymer (Arkema), Ethylene oxide-butylene oxide block copolymers produced by Olin Chemicals, and Surlyn ionomers (Dupont).

The non-particulate impact modifier may comprise a polymerizable group. In the case that the non-particulate impact modifier comprises a polymerizable group, the non-particulate impact modifier may be a further first network monomer, oligomer, or polymer or may be a second network compound, depending on the polymerizable groups of the TPA-based polyester.

The composition may optionally comprise a solvent. A solvent does not have any polymerizable groups. The solvent may be a mixture of more than one solvent. Examples of solvents include alcohols, ketones, esters, or ethers; preferably an alcohol such as methanol, ethanol or isopropanol. In an embodiments, the composition comprises 50 wt % or less of solvent, based on the total weight of the composition, such as 40 wt % or less, 30 wt % or less, 20 wt % or less, 10 wt % or less, 5 wt % or less, or 0 wt %.

Applications

In accordance with an embodiment of the invention, an article may be formed by polymerizing the composition. In an embodiment, a film formed by polymerizing 90% or more of total the polymerizable groups in the composition has a tensile modulus as measured at 150° C. of from 3, from 5, from 7, from 10, from 15, or from 20 MPa to 50, to 45, or to 40 MPa. In an embodiment, a film formed by polymerizing 90% or more of total the polymerizable groups in the composition has a yield stress at 23° C. of from 50 to 90 MPa, and an elongation at break at 23° C. of greater than 3%, optionally in combination with the above tensile modulus as measured at 150° C. In an embodiment, a film formed by polymerizing 90% or more of the total polymerizable groups in the composition has a tensile modulus at 23° C. of from 2000 to 3500 MPa. Tensile modulus at 150° C. is determined by DMTA in accordance with ASTM D5026. Tensile modulus at 23° C., yield stress at 23° C., and elongation at break at 23° C. are determined according to ISO 37:2011 Rubber, vulcanized or thermoplastic—Determination of tensile stress-strain properties.

The amount of the composition that is polymerized is determined using IR by the following method. Samples are measured on a Perkin Elmer Spectrum One equipped with a Universal ATR Sampling accessory. Peak heights are normalized to the carbonyl peak at 1727 cm$^{-1}$, or another peak that does not change. Conversion is calculated using the following formula: % conversion=$((A_0-A_t)/A_0)*100\%$, wherein $A_0$ is the normalized absorbance prior to cure and $A_t$ is the normalized absorbance during curing. For example, conversion of acrylate bonds may be measured by following the decrease of IR absorbance peak at 810 cm$^{-1}$.

Preferred applications of the composition include additive fabrication processes. Additive fabrication processes, sometimes known as three-dimensional printing, utilize computer-aided design (CAD) data of an object to build three-dimensional objects. These three-dimensional objects may be formed from liquid resins, powders, or other materials. The CAD data is loaded into a computer that controls a machine that forms and binds layers of materials into desired shapes. The desired shapes correspond to portions of a three-dimensional object, such as individual cross-sections of the three-dimensional object. The desired shapes may be formed by selectively dispensing the composition, such as in an inkjet printing system, into the desired shape and then curing or melting the composition if necessary. Another way of forming the desired shapes is by selectively curing or melting the material into the desired shape out of a large bed or vat of material, such as in stereolithography or selective laser sintering.

In an embodiment, an article is formed by forming a layer from a first composition comprising the TPA-based polyester and selectively dispensing a second composition comprising one or more first network monomers onto the first composition in accordance with the shape of a portion of a three-dimensional object. The one or more first network initiators may be present either in the layer of TPA-based polyester, in the composition comprising the one or more first network monomers, or both. The composition comprising the one or more first network monomers may be selectively dispensed by jetting, for example by inkjet.

In an embodiment, a method of forming a three-dimensional object comprises the steps of forming a layer of the composition, curing the layer with radiation to form a desired shape, and repeating the steps of forming and curing a plurality of times to obtain a three-dimensional object. In an embodiment, a method of forming a three-dimensional object comprises the steps of selectively dispensing the composition, curing the composition with radiation to form a desired shape, and repeating the steps of selectively dispensing and curing a plurality of times to obtain a three-dimensional object. In an embodiment, a method of forming a three-dimensional object comprises the steps of forming a layer of the composition, selectively curing the layer with radiation to form a desired shape, and repeating the steps of forming and selectively curing a layer of the composition a plurality of times to obtain a three-dimensional object.

In an embodiment, the viscosity of the composition at 30° C. is 4000 cps or less, 3000 cps, or less, 2000 cps or less, 1500 cps or less, or 1200 cps or less. The viscosity of the composition at 30° C. is typically 300 cps or more.

In an embodiment, the composition is present as a liquid at the time that the polymerization reaction is initiated by the application of light or heat. In an embodiment, the liquid composition possesses a temperature of from 25° or more at the time that polymerization is initiated, such as 30° C. or more, 35° C. or more, 40° C. or more, or 45° C. or more. The temperature is typically 200° C. or less, such as 180° C. or less. In an embodiment, the temperature is 150° C. or less, 100° C. or less, 80° C. or less, or 50° C. or less.

In an embodiment, an article can be formed by first introducing the polymerizable composition into a mold or coating the polymerizable composition on a surface.

In an embodiment, the composition is present as separate parts in a kit of materials. The kit comprises a particulate sub-composition comprising the TPA-based polyester, and a liquid sub-composition comprising the one or more first network monomers. The first network initiator may be present with either the TPA-based polyester or the one or more first network monomers, or as a separate part of the kit.

In an embodiment, the particulate sub-composition or the liquid sub-composition further comprises an absorber. An absorber absorbs electromagnetic radiation. In an embodiment, the absorber absorbs one or more of infrared light, near infrared light, and visible light. The wavelengths that are absorbed by the by the absorber should overlap with the wavelengths of the electromagnetic radiation. In an embodiment, the absorber is a pigment, a dye, metallic particles, or carbon black.

The particulate sub-composition may further comprise additives, such as dyes, pigments for coloration, or absorbers. In an embodiment, the particulate sub-composition further comprises a particulate filler. In an embodiment, the particulate filler comprises a polymerizable group that is able to (co)polymerize with the polymerizable groups of the TPA-based polyester. In an embodiment, the particulate sub-composition has a mean particle diameter of from 10 to 100 µm as measured by laser diffraction in accordance with ISO13320 (2009). In an embodiment, the particulate sub-composition has a mean particle diameter of from 30 to 80 µm as measured by laser diffraction in accordance with ISO13320 (2009).

The liquid sub-composition may further comprise additives such as absorbers, reflectors, dyes, or pigments for coloration.

In an embodiment, the composition or liquid sub-composition further comprises a dispersing medium, such that certain components of the composition are dispersed in the dispersing medium. In an embodiment, at least the one or more first network monomers are dispersed in the dispersing medium. In an embodiment, at least one or more first network monomers and one or more first network initiators are dispersed in the dispersing medium. When present, the dispersing medium is typically present in an amount of from 20 to 70 wt %, based on the total weight of the composition, or from 20 to 80 wt % based on the liquid sub-composition. The dispersing medium is a non-solvent, preferably water. When water is the dispersing medium, it is preferred that no cationically curable components are present in the composition. In an embodiment, the composition comprises 50 wt % or more of water, based on the total weight of the composition. An article or coating may be formed by forming a layer of the composition, if necessary evaporating the dispersing medium, and polymerizing the composition.

Some potential applications of articles disclosed herein include as molded articles, shoe soles, eyeglasses, three-dimensional objects formed by additive fabrication processes, coatings for optical fibers, medical devices or coatings on medical devices, other coatings, and paints.

Examples

The following examples are included to further elucidate the present inventions, but should in no way be seen as limiting their scope.

Polyester Synthesis

A reactor vessel fitted with a thermometer, a stirrer and a distillation device for the removal of water formed during the synthesis, was filled with a tin catalyst and 1,2-propanediol and trimethylolpropane if applicable. The vessel was heated up until the mixture reached 110° C. after which terephthalic acid was added and under a nitrogen flow. The temperature was gradually increased to 245° C. while distilling of the reaction water until the acid number of the precursor of the polyester was below 20 mg KOH/g and the hydroxyl value was measured. If needed the reaction mixture was corrected with 1,2-propanediol (15-20 mg KOH/g above the desired hydroxyl value) at 200° C. and heated for another hour at 245° C. before proceeding to the vacuum step. At 200° C. reduced pressure was applied until the polyester reached an acid value below 5 mg KOH/g and the desired hydroxyl value. To further reduce the acid value ethylenecarbonate was added at 190° C. and the amount was based on reducing the measured acid value to zero. The temperature was maintained at 200° C. for one hour after which vacuum was applied for 15 minutes and the mixture was discharged onto an aluminum foil kept at room temperature. The chemical makeup of the polyesters are shown in Tables 0.1 and 0.2.

TABLE 0.1

| | Polyesters | | | | |
|---|---|---|---|---|---|
| Experiment | Terephthalic acid [g] | 1,2-propanediol [g] | Trimethylolpropane [g] | Ethylenecarbonate [g] | Tin-catalyst [g] |
| 003886-001 | 2196.5 | 1120.0 | 0 | 22.0 | 2.8 |
| 003245-072 | 3261.6 | 1888.9 | 178.9 | 27.8 | 3.4 |
| 003245-075 | 2260.2 | 1151.5 | 140.9 | 13.9 | 2.3 |

TABLE 0.2

| | Polyesters | | | | |
|---|---|---|---|---|---|
| Sample code | OH [mg KOH/g] | AV [mg KOH/g] | Mn (g/mol)* | functionality | Tg [° C.] |
| NBK-003886-001 | 38.7 | 3.7 | 2672 | 2 | 64.8 |
| NBK-003245-072 | 130.6 | 1.5 | 977 | 2.3 | 29.3 |
| NBK-003245-074 | 64.5 | 2.3 | 1930 | 2.3 | 57.1 |
| NBK-003245-075 | 71.8 | 1.8 | 2060 | 2.7 | 59.1 |
| NBK-003245-095 | 83.2 | 2.0 | 1848 | 2.9 | 56.9 |
| NBK-003245-096 | 108.4 | 2.8 | 1320 | 2.7 | 46.5 |
| NBK-003245-098 | 111.5 | 2.0 | 1406 | 2.9 | 46.8 |
| NBK-003245-124 | 120.5 | 3.9 | 1217 | 2.7 | 37.3 |

*Theoretical Mn

AV and OH Measurement

The acid (AV) and hydroxyl (OH) values of the polyester were determined titrimetrically according to ISO 2114-2000 and ISO 4629-1978.

Tg Measurement

The glass transition temperature of the resin ($T_g$ in ° C.) was measured via Differential Scanning calorimetry (DSC) on a TA instruments DSC Q20 apparatus, in an atmosphere of $N_2$ calibrated with indium. The processing of the signal (DSC thermogramme, Heat Flow vs. Temperature) was carried out using Universal Analysis 2000 software version 4.5a provided by TA instruments, as described herein after:

A sample of 10±3 mg was weight and placed in the DSC cell. The sample was heated to 150° C. and the temperature was kept at 150° C. for 10 minutes; upon 10 minutes the sample was cooled to 0° C. as fast as possible followed by an equilibration. The sample was heated up to 100° C. at a heating rate of 5° C./minute (thermograph). The thermograph was processed as the Y axis of the thermograph representing the heat flow has exotherm up and the inflection point temperature of the glass transition signal was taken as Tg.

Functionalization of Polyesters with Methacroyl Chloride

The polyesters presented in Table 0.2 were functionalized with methacryloyl chloride to yield a methacrylate functional TPA-polyesters.

NBK-003886-001 ➔ MH-01245-029
NBK-003245-072 ➔ MH-01245-080
NBK-003245-075 ➔ MH-01245-083
NBK-003245-095 ➔ MH-01245-87
NBK-003245-096 ➔ MH-01245-84 and MH-01245-102
NBK-003245-098 ➔ MH-01245-86
NBK-003245-124 ➔ MH-01245-112

Next a typical functionalization experiment with methacryloyl chloride will be described. All above described polyesters are functionalized is the same manner.

MH-01245-029:

NBK-003886-001 (99 g, 39.7 mmol) was weight in a 500 ml 4-neck RB flask. After weighing, the RB flask is fitted with a thermometer, stirring bar, $N_2$ inlet and a septum. The RB flask was flushed with $N_2$ for a minimum of 30 minutes.

250 ml dichloromethane (anhydrous) was injected into the RB flask, with the use of 50 ml glass syringe, through the septum. After which the oligomer is let to dissolve at room temperature. Once the oligomer is completely dissolved, triethylamine (24.19 mL, 174 mmol) was added to the reaction mixture, followed by a drop wise addition of methacryloyl chloride (13.46 mL, 138 mmol). During the addition, an isotherm of approx. 5° C. was observed. The flask was cooled with ice water to control the exothermic reaction. The reaction mixture was analysed after 2.5 hours. The sample was filtered and dried at RT by applying vacuum. The reaction mixture was allowed to stir under $N_2$ conditions overnight at room temperature.

H-NMR was inconclusive, therefore an additional of 10% triethylamine and Methacryloylchloride was added. (1.73 grams of triethylamine and 1.35 grams of methacryloylchloride) to drive the reaction to completion over a time frame of 3 hours and 15 minutes.

The reaction mixture was filtered over a filter (carton) to remove the formed salt. Due to evaporation of the DCM, more salt was precipitating out of the solution. The mixture was cooled in the fridge for 30 minutes and filtered again to remove the salt. The buchner flask and funnel were washed with (2 times 25 mL) dichloromethane. Subsequently the mixture was precipitated in a 5 L Schott-bottle by dropwise addition in Methanol (4.7 Liter) at room temperature. DCM was used to rinse the dropping funnel and flask.

The precipitate was left overnight in the flask without stirring. Next day, the supernatant was removed and the precipitate was washed one time with methanol (200 mL) for 1 hour. Methanol was removed and THF (BHT stabilised, 200 mL) was added to dissolve the polymer. The polymer solution was stored in the fridge over the weekend.

A test sample was taken to determine the OH-conversion. Therefore a sample was analysed before and after addition of TFAA (H-NMR). These samples showed no OH-groups.

After dissolving the oligomer, the product was poured onto a teflon beaker after which, the THF was allowed to evaporate for 24 hours. After evaporation to air, the trays were placed in a vacuum oven at room temperature for 24 hours to remove the remaining THF. Subsequently, the polymer was dried 24 hours at 50° C. to remove residual solvent and triethylamine. The resulting yield was 86.5 grams.

H-NMR analysis showed still residual triethylamine and THF. Therefore, the sample was further dried at 70° C. for two hours afterwhich the temperature of the oven was shut down, allowing it to cool to room temperature overnight.

The yield was 86.0 g, Et3N content ~0.8% mass/mass. This sample is referred to as MH-01245-029.

MH-01245-080:

003245-072 (227 g, 232 mmol) was weighed in a 500 ml 4-neck RB flask. After weighing, the RB flask is fitted with a thermometer, stirring bar, $N_2$ inlet and a septum.

$CH_2Cl_2$ (anhydrous) (250 mL) injected into the RB flask, with the use of 50 ml glass syringe, through the septum, after which the polyester is left to dissolve at room temperature. The flask was cooled with ice water to control the exothermic reaction.

Once the polyester is completely dissolved, triethylamine (78 mL, 558 mmol) is added to the reaction mixture, followed by a drop wise addition of methacryloyl chloride (49.9 mL, 511 mmol). During the addition, an isotherm of approx. 20° C. was observed. Due to bad mixing the temperature increased to max 35° C. The reaction mixture was analyzed after 2 hours. The sample was filtered and dried at RT by applying vacuum. The reaction was complete. The reaction mixture was stirred overnight at room temperature.

The reaction mixture was then cooled for 30 minutes in a freezer. The reaction mixture was filtered over a filter to remove the formed salt. The Büchner flask and funnel were washed with dichloromethane (2 times 20 mL). Subsequently, the mixture was precipitated in a 5 L Schott-bottle by dropwise addition in Methanol (4.5 Liter) at room temperature. DCM (40 mL) was used to rinse the dropping funnel and flask.

The precipitate was left for 2 hours in the flask while stirring. The supernatant was removed by decantation and the precipitate was washed one time with methanol (200 mL) for 1 hour. Methanol was removed and the precipitate dried overnight under reduced pressure in oven at room temperature.

THF (1400 ml) was added to dissolve the polyester. After dissolving the polyester, the product was filtered to remove salt.

After filtration most of the THF was removed with rotavapor and poured into two Teflon® beakers. The remaining THF was removed in an oven at room temperature with max vacuum overnight. Subsequently, the polyester was dried 4 hours at 35° C. to remove residual solvent and Triethylamine. The yield was 75 g.

MH-01245-083:

003245-075 (100 g, 48.5 mmol) was weighed in a 500 ml 4-neck RB flask. After weighing, the RB flask is fitted with a thermometer, stirring bar, $N_2$ inlet and a septum.

$CH_2Cl_2$ (anhydrous) (250 mL) injected into the RB flask, with the use of 50 ml glass syringe, through the septum. After which the polyester is left to dissolve at room temperature. The flask was cooled with ice water to control the exothermic reaction.

Once the polyester is completely dissolved triethylamine (42.7 mL, 306 mmol) is added to the reaction mixture, followed by a drop wise addition of methacryloyl chloride (27.5 mL, 282 mmol). During the addition, an isotherm was observed; max temperature was 20° C. The reaction was analyzed after 2 hours of stirring. 10% triethylamine and 10% methacryloylchloride was additionally added to drive the reaction to completion.

The reaction was stirred (50 RPM) overnight at room temperature. The reaction was analyzed via H-NMR and it was observed that the reaction was completed.

The reaction mixture was cooled for 30 minutes in freezer. The reaction mixture was filtered over a filter to remove the formed salt. The Büchner flask and funnel were washed with (2 times 20 mL) dichloromethane. Subsequently, the mixture was precipitated in a 5 L Schott-bottle by dropwise addition in Methanol (4.5 Liter) at room temperature. DCM (40 mL) was used to rinse the dropping funnel and flask.

The precipitate was left for 2 hours in the flask while shaking. The supernatant was removed by decantation and the precipitate was washed one time with methanol (200 mL) for 1 hour. Methanol was removed and the precipitate dried overnight under reduced pressure in an oven at room temperature.

THF (200 ml) was added to dissolve the polyester. After dissolving the polyester, the product was filtered to remove salt.

After filtration, most of the THF was removed with rotavapor and poured into two Teflon® beakers. The remaining THF was removed in an oven at room temperature for 4 hours and subsequently the polyester was dried for 4 hours at 50° C. to remove residual solvent and triethylamine. The yield was 85 g. P-NMR showed no primary or secondary alcohol groups.

Alternative Functionalization Method Via IPDI-HEMA Route

An alternative way to functionalize the polyester (e.g., NBK-003245-124), is to perform an urethane synthesis reacting the polyester with isophorone diisocyanate and hydroxy ethyl methacrylate in the preferred reactive diluent. This process yields the polyester urethane methacrylate in reactive diluent, in this case benzyl methacrylate. Into a glass reactor equipped with lean air, 979.5 g isophorone diisocyanate (1,463 mol), 3 g butylated hydroxy toluene (500 ppm), 1200 g benzyl methacrylate and 3 g dibutyl tin dilaurate is added and allowed to mix for 5 minutes. Over a time frame of 3 hours, 573.5 g hydroxy ethyl methacrylate is added whilst cooling the reactor. After 1 hour 1200 g benzyl methacrylate and 3 g dibutyl tin dilaurate and allowed to mix for 10 minutes. Then 2038.0 g TPA-polyester (NBK-003245-124) is added and the mixture is heated to 85° C. The reaction is continued over approx. 16 hours at 85° C. Subsequently, the reactor is discharged over a 125 micron filter. The resulting material is a 60/40 mixture of polyester urethane methacrylate in benzyl methacrylate (NBK-003068-110).

Composition Formation

The solid polyester is added into a UV-protected vial supplied with a screw cap. Then the reactive diluent is added. The mixture is stirred and heated at 80° C. in order to dissolve. Once the mixture is homogeneous, Irgacure 819 is added (2% of total mass) and allowed to dissolve.

Curing

Glass was pre-treated with a fluor silane and allowed to react overnight at 120° C. The films are made with a doctor blade (500 μm) on the pre-treated glass and then cured on a Fusion UV-rig equipped with nitrogen flow under a D-bulb at 30° C. Total UV-dose was approximately 7 J/cm$^2$ at 13 W/cm$^2$ (sum of UVA, UVB and UVC).

80° C. cure conditions: Castings were prepared by sandwiching pre-treated glass plates with 1 mm spacers. The formulation is pre-heated to 80° C. and subsequently poured into the casting. UV-cure was performed with a static UV-source equipped with an H-bulb for 3 minutes. Total UV-dose was approximately 30 J/cm$^2$ at 0.2 W/cm$^2$.

Thermal post-cure: In order to ensure complete conversion of the materials, all samples were post cured at 100° C. overnight in air prior to measuring the mechanical properties.

DMTA

Samples with a width of approximately 2 mm are punched out of the cured films. The thickness is measured with a calibrated Heidenhain thickness meter. The dynamic mechanical analyses are carried out in accordance with ASTM D5026 using a RSA-G2 test system at a frequency of 1 Hz and over a temperature ranging from −100° C. to 200° C. with a heating rate of 5° C./min. During the measurements, the storage modulus (E'), loss modulus (E") and tangent delta (tan δ) are determined as a function of temperature.

Tensile Tests

Tensile properties are measured according to the international standard ISO 37 (3$^{rd}$ Edition 1994-05-15) "Rubber, vulcanized or thermoplastic—Determination of tensile stress-strain properties" on a Zwick digital tensile machine type Z010. The parameters of the tensile test are shown in Table 0.3.

TABLE 0.3

| Tensile Test Machine Parameters | |
| --- | --- |
| Machine | Zwick Z010 table 2 |
| Control & analysis | Zwick software, TestXpert II |
| Load-cell | 2.5 kN loadcell |
| Displacement | MultiXtense |
| Grips fixture | 1 kN pneumatic grips |
| E-modulus speed | 1 mm/min |
| Modulus determination strain | between 0.05 and 0.25% |
| Test speed tensile | 5 mm/min |
| Grip-to grip distance | 54 mm |
| L0 | 25 mm |
| Pre-load | 0.5 N |
| Tensile standard | ISO 527 |
| Tensile specimen type | 1BA |

Example 1

A composition is prepared consisting of 70 parts by weight of TPA-based polyester MH-01245-029 (functionality 2, Mn ~2500 g/mol), 30 parts by weight of (hydroxylethyl methacrylate) HEMA, and 2 parts by weight Irgacure® 819. The sample is cured at 80° C. DMTA Results are shown in Table 1.1. Tensile Data is shown in FIG. 1 and reported in Table 1.2.

TABLE 1.1

| Example 1 DMTA Results | |
| --- | --- |
| Tg (E" max, ° C.) | 90 |
| Cross-link Density as determined by tensile modulus at 150° C. (MPa) | 3 |

TABLE 1.2

| Example 1 Tensile Results | |
| --- | --- |
| Tensile Modulus (GPa) | 2.7 |
| Yield Stress (MPa) | 65 |

Example 2

Figure 2:
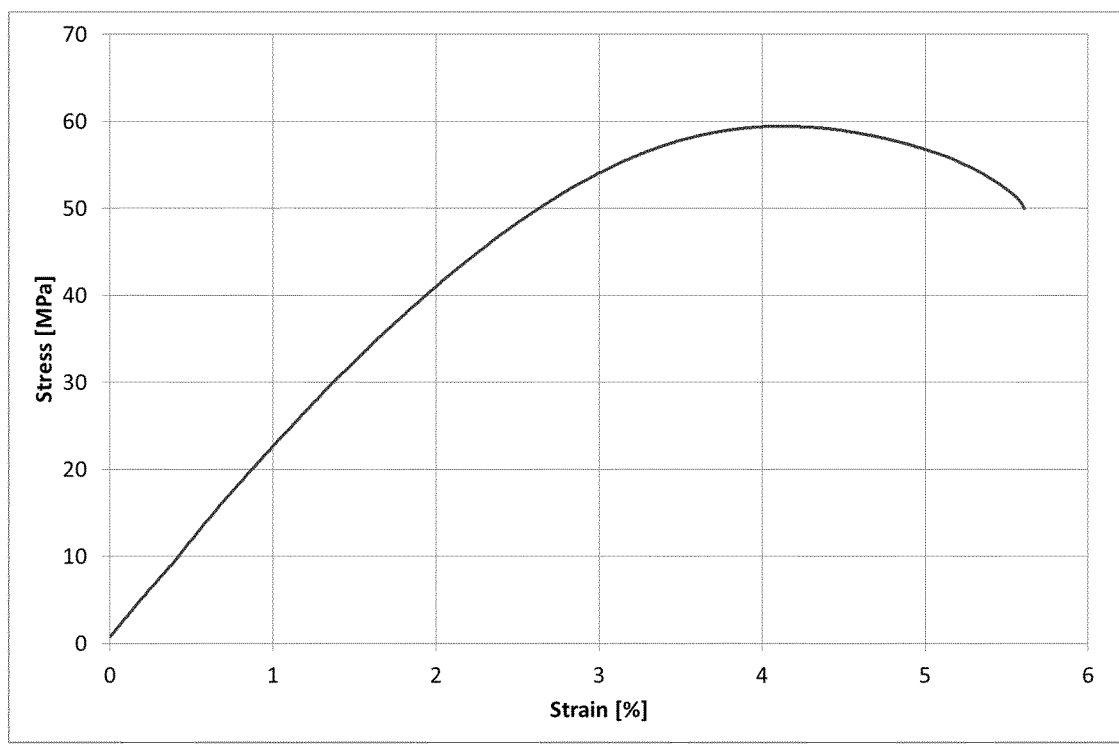
FIG. 2 is a graph of tensile data.

A composition is prepared consisting of 60 parts by weight of TPA-based polyester MH-01245-083 (functionality 2.7, Mn ~2000 g/mol), 40 parts by weight of HEMA, and 2 parts by weight Irgacure® 819. The sample is cured at 30° C. DMTA Results are shown in Table 2.1. Tensile Data is shown in FIG. 2 and reported in Table 2.2.

TABLE 2.1

| Example 2 DMTA Results | |
| --- | --- |
| Tg (E", ° C.) | 90 |
| Cross-link Density as determined by tensile modulus at 150° C. (MPa) | 7 |

TABLE 2.2

| Example 2 Tensile Results | |
| --- | --- |
| Tensile Modulus (GPa) | 2.5 |
| Yield Stress (MPa) | 60 |

Examples 3-5

Various 60/40 (i.e. 60 parts per weight of TPA-based polyester, 40 parts per weight of HEMA, and 2 parts per weight of photoinitiator Irgacure 819) compositions of TPA-polyesters with varying functionality and molecular weight were next created. The Tg and cross-link density as determined by tensile modulus at 150° C. of each (Example 3: MH-01245-087, with a functionality of 2.85, Mn ~2050 g/mol; Example 4: MH-01245-084, functionality 2.62, Mn ~1500 g/mol; and Example 5: MH-01245-086, functionality 2.84, Mn ~1600 g/mol) is shown in table 2.3 below.

TABLE 2.3

Tg and Tensile Results of Examples 3-5

|  | Example 3 | Example 4 | Example 5 |
|---|---|---|---|
| Tg (E" max, ° C.) | 89 | 84 | 82 |
| Cross-link Density as determined by tensile modulus at 150° C. (MPa) | 7 | 6 | 6 |

Examples 6-11

The effect of various first network monomers was next determined by creating various mixtures including 60 parts per weight of TPA-based polyester MH-01245-084 (having a functionality of 2.62 and Mn of ~1500 g/mol), 40 parts per weight of the respective diluent (Example 6: isobornyl methacrylate or IBOMA; Example 7: benzyl methacrylate or BMA; Example 8: cyclohexyl methacrylate or CHMA; Example 9: tetrahydrofurfuryl methacrylate or THFMA; Example 10: hydroxy propyl methacrylate or HPMA; and Example 11: hydroxy ethylmethacrylate or HEMA), and 2 parts per weight of photoinitiator Irgacure 819) compositions. Again the Tg and cross-link density as determined by tensile modulus at 150° C. of each was determined and is recorded in table 2.4 below.

TABLE 2.4

Tg and Tensile Results of Examples 6-11

|  | Ex. 6 | Ex. 7 | Ex. 8 | Ex. 9 | Ex. 10 | Ex. 11 |
|---|---|---|---|---|---|---|
| Tg (E" max, ° C.) | 109 | 78 | 98 | 78 | 78 | 84 |
| Cross-link Density as determined by tensile modulus at 150° C. (MPa) | 6 | 5 | 5 | 6 | 5 | 6 |

Examples 12-15

The effect on network structure of materials that contained a cationically polymerizable fraction was observed in Examples 12-15. The cationic portion is Somos® NeXt (available from DSM) centrifuged to remove any solid particles (0763-119). The compositions used in these experiments (which again determined Tg and cross-link density as determined by tensile modulus at 150° C.) is reported in Table 2.5, with the results reflected in 2.6.

TABLE 2.5

Composition of Examples 12-15

| Component | Ex. 12 | Ex. 13 | Ex. 14 | Ex. 15 |
|---|---|---|---|---|
| NBK-03068-110 | 95 | 90 | 80 | 70 |
| 0763-119 | 5 | 10 | 20 | 30 |
| Irgacure 819 | 2 | 2 | 2 | 2 |

TABLE 2.6

Tg and Tensile Results of Examples 12-15

| Component | Ex. 12 | Ex. 13 | Ex. 14 | Ex. 15 |
|---|---|---|---|---|
| Tg (E" max, ° C.) | 79 | 66 | 50 | 31 |
| Cross-link Density as determined by tensile modulus at 150° C. (MPa) | 5 | 5 | 4 | 4 |

Example 16

Finally, an experiment was conducted whereby the suitability of a composition according to the present invention was tested in a simulated powder/binder 3D printing process. Accordingly, 15 grams of polyester was sieved with 212 micron sieve. 4 grams of this sieved powder was divided homogeneously on a plate. In the mean time 3.54 grams of THFMA and 89 mg BAPO (bis acyl phosphine oxide) was mixed. This mixture was spreaded over the plate and allowed to "mix". After 15 minutes at 40° C. almost everything "dissolved". The plate was then UV-cured by means of Fusion H-bulb for 1 minute. A DMTA graph was plotted, with the results summarized in Table 2.7.

TABLE 2.7

Tg and Tensile Results of Example 16

| Component | Ex. 16 |
|---|---|
| Tg (E" max, ° C.) | 88 |
| Cross-link Density as determined by tensile modulus at 150° C. (MPa) | 8 |

Discussion of Results

As can be seen in the experiments relative to Examples 1 and 2, the formed network achieves a high Tg (approx. 90° C.) and low cross-link density (3-10 MPa). These values are superior relative to existing materials used in stereolithography. Generally, stereolithography materials behave in a relatively more brittle fashion, commonly with a yield stress significantly higher than 70 MPa, whereas the formed network achieves a yield stress of 65 MPa.

The experiments relative to Examples 3-5 reinforce that the desired network structure can be achieved with different molecular weights and functionalities.

The experiments relative to Examples 6-11 reinforce that the technical effect of compositions of the current invention is achieved with a wide variety of known diluents/first network monomers. In particular, the network density for all diluents is substantially similar, whereas the Tg is dominated by the homopolymer Tg of the mono-functional diluent itself.

The experiments relative to Examples 12-15 reinforce that the technical effect of compositions of the current invention may be achieved with the inclusion of a cationically-polymerizable network forming component as well.

The process and experiments relative to Example 16 demonstrates the suitability of compositions according to the present invention in powder/binder type 3D printing applications.

Supplementary Description of Certain Exemplary Embodiments

1) A composition for forming a three-dimensional object via an additive fabrication process comprising:
   a. from 30 to 100 wt %, based on the total weight of the composition, of a first network-forming component consisting of:
      i. from 19.95 to 80 wt %, based on the total weight of the first network-forming component, of a TPA-based polyester comprising a backbone and having a number average of at least 2 polymerizable groups, wherein the backbone comprises the reaction product of a terephthalic acid and a polyol, wherein the polymerizable groups comprise acrylate, methacrylate, epoxy, oxetane, hydroxyl, itaconate, vinyl ether, allyl ether, maleate, or fumarate, and wherein the TPA-based polyester has a number average molecular weight of from 800 to 10000 g/mol and a Tg of 40° C. or more;
      ii. from 19.95 to 80 wt %, based on the total weight of the network-forming component, of one or more first network monomers having a number average of 0.95 to 1.1 polymerizable groups that are able to (co)polymerize with the polymerizable groups of the TPA-based polyester, wherein a linear polymer formed from the one or more first network monomers has a Tg of 40° C. or more;
      iii. from 0.05 to 5 wt %, based on the total weight of the first network-forming component, of one or more first network initiators capable of initiating the polymerization of the TPA-based polyester and the first network monomer; and
      iv. optionally, up to 15 wt % of one or more further first network monomers, oligomers, or polymers having a number average of 2 or more polymerizable groups that are able to (co)polymerize with the polymerizable groups of the TPA-based polyester or the one or more first-network monomers;
   b. optionally, a second network-forming component comprising one or more second network compounds comprising polymerizable groups that do not (co)polymerize with the polymerizable groups of the TPA-based polyester, and a second network initiator for initiating the polymerization of the one or more second network compounds; and
   c. optionally, a particulate filler comprising a polymerizable group that is able to (co)polymerize with the polymerizable groups of the TPA-based polyester.

2) A kit of materials comprising a particulate sub-composition and a liquid sub-composition, which when combined forms a composition for forming an object by an additive fabrication process that comprises a first-network forming component comprising polymerizable groups, and optionally a second network-forming component that does not (co)polymerize with the polymerizable groups of the first-network forming component, the kit comprising:
   a. a particulate sub-composition comprising:
      i. from 19.95 to 80 wt %, based on the total weight of the first network-forming component, of a TPA-based polyester comprising a backbone and having a number average of at least 2 polymerizable groups, wherein the backbone comprises the reaction product of a terephthalic acid and a polyol, wherein the polymerizable groups comprise acrylate, methacrylate, epoxy, oxetane, hydroxyl, itaconate, vinyl ether, allyl ether, maleate, or fumarate, and wherein the TPA-based polyester has a number average molecular weight of from 800 to 10000 g/mol and a Tg of 40° C. or more;
      ii. optionally, a particulate filler comprising a polymerizable group that is able to (co)polymerize with the polymerizable groups of the TPA-based polyester;
   b. a liquid sub-composition comprising:
      i. from 19.95 to 80 wt %, based on the total weight of the network-forming component, of one or more first network monomers having a number average of 0.95 to 1.1 polymerizable groups that are able to (co)polymerize with the polymerizable groups of the TPA-based polyester, wherein a linear polymer formed from the one or more first network monomers has a Tg of 40° C. or more;
      ii. optionally, up to 15 wt % of one or more further first network monomers, oligomers, or polymers having a number average of 2 or more polymerizable groups that are able to (co)polymerize with the polymerizable groups of the TPA-based polyester or the one or more first-network monomers;
   c. from 0.05 to 5 wt %, based on the total weight of the first network-forming component, of one or more first network initiators capable of initiating the polymerization of the TPA-based polyester and the first network monomer, wherein the one or more first network initiators may be present in the particulate sub-composition, the liquid sub-composition, or both; and
   d. optionally, a second network-forming component comprising one or more second network compounds comprising polymerizable groups that do not (co)polymerize with the polymerizable groups of the TPA-based polyester, and a second network initiator for initiating the polymerization of the one or more second network compounds, wherein the substituents of the second network-forming component may be present in the particulate sub-composition, the liquid sub-composition, or partially in the particulate sub-composition and partially in the liquid sub-composition.

3) The composition or kit according to any one of the preceding exemplary embodiments, wherein the first network-forming component consists of the TPA-based polyester, the one or more first network monomers, the one or more first network initiators, and, optionally, up to 15 wt % of the further first network monomer, oligomer, or polymer.

4) The composition or kit according to any one of the preceding exemplary embodiments, wherein the first network-forming component consists of the TPA-based polyester, the one or more first network monomers, and the one or more first network initiators.

5) The composition or kit according to any one of the preceding exemplary embodiments, wherein the TPA-based polyester is soluble in the one or more first network monomers.

6) The composition or kit according to any one of the preceding exemplary embodiments, wherein the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the total weight of the composition.

7) The composition or kit according to any one of the preceding exemplary embodiments, wherein the first network-forming component is present in an amount of 100 wt % or less, 90 wt % or less, 80 wt % or less, 70 wt % or less, or 60 wt % or less, based on the total weight of the composition.

8) The composition or kit according to any one of the preceding exemplary embodiments, wherein the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the total weight of the composition, excluding the weight of any solvent.

9) The composition or kit according to any one of the preceding exemplary embodiments, wherein the first network-forming component is present in an amount of 100 wt % or less, 90 wt % or less, 80 wt % or less, 70 wt % or less, or 60 wt % or less, based on the total weight of the composition, excluding the weight of any solvent.

10) The composition or kit according to any one of the preceding exemplary embodiments, wherein the first network-forming component is present in an amount of 20 wt % or more, 25 wt % or more, 30 wt % or more, 35 wt % or more, 40 wt % or more, 50 wt % or more, 60 wt % or more, 70 wt % or more, 80 wt % or more, 90 wt % or more, 95 wt % or more, or 100 wt %, based on the total weight of the composition excluding the weight of any solvent and the weight of any components that do not comprise a polymerizable group (e.g. a non-reactive particulate filler).

11) The composition or kit according to any one of the preceding exemplary embodiments, wherein the first network-forming component is present in an amount of 100 wt % or less, 90 wt % or less, 80 wt % or less, 70 wt % or less, or 60 wt % or less, based on the total weight of the composition excluding the weight of any solvent and the weight of any components that do not comprise a polymerizable group (e.g. a non-reactive particulate filler).

12) The composition or kit according to any one of the preceding exemplary embodiments, wherein the further first network monomer, oligomer, or polymer is present.

13) The composition or kit according to any one of the preceding exemplary embodiments, wherein the TPA-based polyester is linear.

14) The composition or kit according to any one of the preceding exemplary embodiments, wherein the TPA-based polyester is branched.

15) The composition or kit according to any one of the preceding exemplary embodiments, wherein the polyol is an aliphatic polyol or an aromatic polyol.

16) The composition or kit according to any one of the preceding exemplary embodiments, wherein the polyol has at least 2, at least 3, at least 4, at least 5, or at least 6 hydroxyl groups.

17) The composition or kit according to any one of the preceding exemplary embodiments, wherein the polyol has at most 2, at most 3, at most 4, at most 5, at most 6, at most 8, or at most 10 hydroxyl groups.

18) The composition or kit according to any one of the preceding exemplary embodiments, wherein the Tg of the TPA-based polyester is at least 45° C., at least 50° C., at least 55° C., at least 60° C., at least 65° C., or at least 70° C.

19) The composition or kit according to any one of the preceding exemplary embodiments, wherein the Tg of the TPA-based polyester is 150° C. or less, 125° C. or less, or 120° C. or less.

20) The composition or kit according to any one of the preceding exemplary embodiments, wherein the polyol comprises a polyalkylene polyol.

21) The composition or kit according to any one of the preceding exemplary embodiments, wherein the TPA-based polyester comprises a further polyacid other than terephthalic acid.

22) The composition or kit according to any one of the preceding exemplary embodiments, wherein the TPA-based polyester comprises a further polyacid other than terephthalic acid, and the further polyacid comprises phthalic acid or isophthalic acid.

23) The composition or kit according to any one of the preceding exemplary embodiments, wherein the TPA-based polyester comprises a further polyacid other than terephthalic acid, and the further polyacid comprises adipic acid, sebacic acid, phthalic acid, isophthalic acid, octadecanedioic acid, pimelic acid, suberic acid, azelaic acid, brassilic acid, dodecanedioic acid, glutaric acid, maleic acid, fumaric acid, 6-naphthalenedicarboxylic acid, 4,4'-oxybisbenzoic acid, 3,6-dichlorophthalic acid, tetrachlorophthalic acid, tetrahydrophthalic acid, hexahydroterephthalic acid, hexachloroendomethylenetetrahydrophthalic acid, endomethylenetetrahydrophthalic acid, decanedicarboxylic acid, succinic acid, or trimellitic acid.

24) The composition or kit according to any one of the preceding exemplary embodiments, wherein at least 20 mol %, at least 30 mol %, at least 40 mol %, at least 50 mol %, at least 60 mol %, at least 70 mol %, at least 75 mol %, at least 80 mol %, at least 85 mol %, at least 90 mol %, at least 95 mol %, at least 98 mol %, or 100 mol % of the backbone of the TPA-based polyester comprises the reaction product of a polyacid and a polyol.

25) The composition or kit according to any one of the preceding exemplary embodiments, wherein at most 100 mol %, at most 98 mol %, at most 95 mol %, at most 90 mol %, at most 80 mol %, at most 70 mol %, or at most 60 mol % of the backbone of the TPA-based polyester comprises the reaction product of a polyacid and a polyol.

26) The composition or kit according to any one of the preceding exemplary embodiments, wherein at least 20 mol %, at least 30 mol %, at least 40 mol %, at least 50 mol %, at least 60 mol %, at least 70 mol %, at least 75 mol %, at least 80 mol %, at least 85 mol %, at least 90 mol %, at least 95 mol %, at least 98 mol %, or 100 mol % of the backbone of the TPA-based polyester comprises the reaction product of a TPA and a polyol.

27) The composition or kit according to any one of the preceding exemplary embodiments, wherein at most 100 mol %, at most 98 mol %, at most 95 mol %, at most 90 mol %, at most 80 mol %, at most 70 mol %, or at most 60 mol % of the backbone of the TPA-based polyester comprises the reaction product of a TPA and a polyol.

28) The composition or kit according to any one of the preceding exemplary embodiments, wherein the TPA-based polyester has a number average of at least 2 polymerizable groups, wherein the polymerizable groups comprise acrylate, methacrylate, hydroxyl, epoxy, oxetane, or itaconate.

29) The composition or kit according to any one of the preceding exemplary embodiments, wherein the TPA-based polyester has a number average of at least 2 polymerizable groups, wherein the polymerizable groups consist of acrylate, methacrylate, hydroxyl, epoxy, oxetane, or itaconate.

30) The composition or kit according to any one of the preceding exemplary embodiments, wherein the TPA-based polyester has a number average of at least 2 polymerizable groups, wherein the polymerizable groups comprise acrylate, methacrylate, epoxy, or oxetane.

31) The composition or kit according to any one of the preceding exemplary embodiments, wherein the TPA-based polyester has a number average of at least 2 polymerizable groups, wherein the polymerizable groups consist of acrylate, methacrylate, epoxy, or oxetane.

32) The composition or kit according to any one of the preceding exemplary embodiments, wherein the TPA-based polyester has a number average of at least 2 polymerizable groups, wherein the polymerizable groups comprise acrylate, methacrylate, or epoxy.

33) The composition or kit according to any one of the preceding exemplary embodiments, wherein the TPA-based polyester has a number average of at least 2 polymerizable groups, wherein the polymerizable groups consist of acrylate, methacrylate, or epoxy.

34) The composition or kit according to any one of the preceding exemplary embodiments, wherein the TPA-based polyester has a number average of at least 2 polymerizable groups, wherein the polymerizable groups comprise acrylate or methacrylate.

35) The composition or kit according to any one of the preceding exemplary embodiments, wherein the TPA-based polyester has a number average of at least 2 polymerizable groups, wherein the polymerizable groups consist of acrylate or methacrylate.

36) The composition or kit according to any one of the preceding exemplary embodiments, wherein the TPA-based polyester has a number average of at least 2 polymerizable groups, wherein the polymerizable groups comprise methacrylate.

37) The composition or kit according to any one of the preceding exemplary embodiments, wherein the TPA-based polyester has a number average of at least 2 polymerizable groups, wherein the polymerizable groups consist of methacrylate.

38) The composition or kit according to any one of the preceding exemplary embodiments, wherein the TPA-based polyester has a number average of at least 2 polymerizable groups, wherein the polymerizable groups comprise endgroups.

39) The composition or kit according to any one of the preceding exemplary embodiments, wherein the TPA-based polyester has a number average of at least 2 polymerizable groups, wherein the polymerizable groups consist of endgroups.

40) The composition or kit according to any one of the preceding exemplary embodiments, wherein the TPA-based polyester has a number average of at least 2 polymerizable groups, wherein the polymerizable groups consist of endgroups and there are no polymerizable groups that are not endgroups in the TPA-based polyester.

41) The composition or kit according to any one of the preceding exemplary embodiments, wherein the TPA-based polyester has a number average of at least 2.0, at least 2.1, at least 2.2, at least 2.3, at least 2.4, at least 2.5, at least 2.6, or at least 2.7 polymerizable groups per molecule.

42) The composition or kit according to any one of the preceding exemplary embodiments, wherein the TPA-based polyester has a number average of at most 10, at most 9, at most 8, at most 7, at most 6, at most 5, at most 4.5, at most 4, at most 3.5, or at most 3 polymerizable groups per molecule.

43) The composition or kit according to any one of the preceding exemplary embodiments, wherein the TPA-based polyester has a number average molecular weight of at least 800 g/mol, at least 900 g/mol, at least 1000 g/mol, at least 1100 g/mol, at least 1200 g/mol, at least 1300 g/mol, at least 1400 g/mol, or at least 1500 g/mol.

44) The composition or kit according to any one of the preceding exemplary embodiments, wherein the TPA-based polyester has a number average molecular weight of at most 10,000 g/mol, at most 9,000 g/mol, at most 8,000 g/mol, at most 7000 g/mol, at most 6,000 g/mol, at most 5,000 g/mol, at most 4,000 g/mol, or at most 3,000 g/mol.

45) The composition or kit according to any one of the preceding exemplary embodiments, wherein the TPA-based polyester has a number average of from 2 to 3 polymerizable groups, and the amount, number average molecular weight, and number average of polymerizable groups of the TPA-based polyester in the composition satisfies the following equation:

$$X\ MPa \le 3*R*T*\left[(3-f)*\left(\frac{\rho*w_{polyester}}{M_{polyester}}\right)+(f-2)*3*\left(\frac{\rho*w_{polyester}}{M_{polyester}}\right)\right] \le Y\ MPa$$

wherein R is the gas constant 8.314 cm$^3$ MPa K$^{-1}$ mol$^{-1}$, T is 423.15 K, f is the number average of polymerizable groups of the TPA-based polyester, $\rho$ is the density of the TPA-based polyester in g/cm$^3$, $M_{polyester}$ is the number average molecular weight of the TPA-based polyester in g/mol, and $w_{polyester}$ is the weight fraction of the TPA-based polyester in the first network-forming component, X is 3, and Y is 50.

46) The composition or kit according to any one of the preceding exemplary embodiments, wherein the TPA-based polyester has a number average of from 2 to 3 polymerizable groups, and the amount, number average molecular weight, and number average of polymerizable groups of the TPA-based polyester in the composition satisfies the following equation:

$$X\ MPa \le 3*R*T*\left[(3-f)*\left(\frac{\rho*w_{polyester}}{M_{polyester}}\right)+(f-2)*3*\left(\frac{\rho*w_{polyester}}{M_{polyester}}\right)\right] \le Y MPa$$

wherein R is the gas constant 8.314 cm³ MPa K⁻¹ mol⁻¹, T is 423.15 K, f is the number average of polymerizable groups of the TPA-based polyester, ρ is the density of the TPA-based polyester in g/cm³, $M_{polyester}$ is the number average fraction of the TPA-based polyester in the first network-forming component, X is 3, 5, 7, 10, 15 or 20, and Y is 50, 45, or 40.

47) The composition or kit according to any one of the preceding exemplary embodiments, wherein the TPA-based polyester is present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition.

48) The composition or kit according to any one of the preceding exemplary embodiments, wherein the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.

49) The composition or kit according to any one of the preceding exemplary embodiments, wherein the TPA-based polyester is present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent.

50) The composition or kit according to any one of the preceding exemplary embodiments, wherein the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.

51) The composition or kit according to any one of the preceding exemplary embodiments, wherein the TPA-based polyester is present in an amount of at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the first network-forming component.

52) The composition or kit according to any one of the preceding exemplary embodiments, wherein the TPA-based polyester is present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the first network-forming component.

53) The composition or kit according to any one of the preceding exemplary embodiments, wherein the TPA-based polyester comprises a polymerizable group comprising acrylate, methacrylate, itaconate, allyl ether, maleate, or fumarate and the first network monomer and optional further first network monomer, oligomer, or polymer are free radically polymerizable compounds and the first network initiator is a free-radical initiator.

54) The composition or kit according to any one of the preceding exemplary embodiments, wherein the TPA-based polyester comprises a polymerizable group comprising hydroxyl, epoxy, or oxetane and the first network monomer and optional further first network monomer, oligomer, or polymer are cationically polymerizable compounds and the first network initiator is a cationic initiator.

55) The composition or kit according to any one of the preceding exemplary embodiments, wherein the TPA-based polyester comprises a number average of at least 2 acrylate, methacrylate, itaconate, allyl ether, maleate, or fumarate groups per molecule, the one or more first network monomers comprise an acrylate, methacrylate, itaconate, vinyl ether, allyl ether, maleate, or fumarate group and the optional further first network monomer, oligomer or polymer comprises a number average of 2 or more acrylate, methacrylate, itaconate, vinyl ether, allyl ether, maleate, or fumarate groups.

56) The composition or kit according to any one of the preceding exemplary embodiments, wherein the TPA-based polyester comprises a number average of at least 2 hydroxyl, epoxy, or oxetane groups per molecule, the one or more first network monomers comprise a hydroxyl, epoxy, oxetane, or vinyl ether group and the optional further first network monomer, oligomer or polymer comprises a number average of 2 or more hydroxyl, epoxy, oxetane, or vinyl ether groups.

57) The composition or kit according to any one of the preceding exemplary embodiments, wherein the TPA-based polyester comprises a number average of at least 2 vinyl ether groups per molecule, the one or more first network monomers comprise an acrylate, methacrylate, itaconate, hydroxyl, epoxy, oxetane, vinyl ether, allyl ether, maleate, or fumarate group and the optional further first network monomer, oligomer or polymer comprises a number average of 2 or more acrylate, methacrylate, itaconate, hydroxyl, epoxy, oxetane, vinyl ether, allyl ether, maleate, or fumarate groups.

58) The composition or kit according to any one of the preceding exemplary embodiments, wherein the first network initiator is a free-radical photo-initiator.

59) The composition or kit according to any one of the preceding exemplary embodiments, wherein the first network initiator is a cationic photo-initiator.

60) The composition or kit according to any one of the preceding exemplary embodiments, wherein the TPA-based polyester is amorphous.

61) The composition or kit according to any one of the preceding exemplary embodiments, wherein the TPA-based polyester comprises a blend of amorphous and semi-crystalline TPA-based polyesters.

62) The composition or kit according to any one of the preceding exemplary embodiments, wherein the TPA-based polyester comprises a blend of amorphous, semi-crystalline, and crystalline TPA-based polyesters.

63) The composition or kit according to any one of the preceding exemplary embodiments, wherein the TPA-based polyester comprises a blend of at least two different TPA-based polyesters, wherein a first TPA-based polyester has a number average of more than three polymerizable groups per molecule, wherein a second TPA-based polyester has a number average of less than three polymerizable groups per molecule, and wherein the number average polymerizable groups per molecule of the TPA-based polyester is from two to three polymerizable groups per molecule.

64) The composition or kit according to any one of the preceding exemplary embodiments, wherein the TPA-based polyester comprises at least one acrylate group and at least one methacrylate group.

65) The composition or kit according to any one of the preceding exemplary embodiments, wherein the TPA-based polyester comprises i) at least one acrylate or methacrylate group, and ii) at least one epoxy group, the one or more first network monomers comprise an acrylate, methacrylate, itaconate, hydroxyl, epoxy, oxetane, vinyl ether, allyl ether, maleate, or fumarate group and the optional further first network monomer, oligomer or polymer comprises a number average of 2 or more acrylate, methacrylate, itaconate, hydroxyl, epoxy, oxetane, vinyl ether, allyl ether, maleate, or fumarate groups.

66) The composition or kit according to any one of the preceding exemplary embodiments, wherein the TPA-based polyester comprises i) at least one polymerizable group selected from acrylate, methacrylate, itaconate, allyl ether, maleate, or fumarate, and ii) at least one polymerizable group selected from hydroxyl, epoxy, or oxetane, the one or more first network monomers comprise an acrylate, methacrylate, itaconate, hydroxyl, epoxy, oxetane, vinyl ether, allyl ether, maleate, or fumarate group and the optional further first network monomer, oligomer or polymer comprises a number average of 2 or more acrylate, methacrylate, itaconate, hydroxyl, epoxy, oxetane, vinyl ether, allyl ether, maleate, or fumarate groups.

67) The composition or kit according to any one of the preceding exemplary embodiments, wherein the first network monomer has a number average of 0.95 polymerizable groups or more, 0.97 polymerizable groups or more, or 0.99 polymerizable groups or more.

68) The composition or kit according to any one of the preceding exemplary embodiments, wherein the first network monomer has a number average of 1.1 polymerizable groups or less, 1.08 polymerizable groups or less, 1.06 polymerizable groups or less, 1.04 polymerizable groups or less, or 1.02 polymerizable groups or less. In an embodiment, the first network monomer has a number average of 1.0 polymerizable groups.

69) The composition or kit according to any one of the preceding exemplary embodiments, wherein a linear polymer formed from the one or more first network monomers has a Tg of 50° C. or more, 60° C. or more, 65° C. or more, 70° C. or more, 75° C. or more, 80° C. or more, 85° C. or more, 90° C. or more, 95° C. or more, or 100° C. or more.

70) The composition or kit according to any one of the preceding exemplary embodiments, wherein a linear polymer formed from the one or more first network monomers has a Tg of 150° C. or less, 130° C. or less, 125° C. or less, or 120° C. or less.

71) The composition or kit according to any one of the preceding exemplary embodiments, wherein the one or more first network monomers has a molecular weight of 800 g/mol or less, 700 g/mol or less, 600 g/mol or less, 500 g/mol or less, 400 g/mol or less, 350 g/mol or less, 300 g/mol or less, 250 g/mol or less, or 200 g/mol or less.

72) The composition or kit according to any one of the preceding exemplary embodiments, wherein the one or more first network monomers has a molecular weight of 100 g/mol or more, or 150 g/mol or more.

73) The composition or kit according to any one of the preceding exemplary embodiments, wherein the TPA-based polyester comprises a polymerizable group comprising acrylate, methacrylate, itaconate, vinyl ether, allyl ether, maleate, or fumarate and the first network monomer comprises methyl (meth)acrylate, hydroxy ethyl (meth)acrylate, ethyl (meth)acrylate, propyl (meth)acrylate, isopropyl (meth)acrylate, isobutyl (meth)acrylate, t-butyl (meth)acrylate, hydroxy propyl (meth)acrylate, cyclohexyl (meth)acrylate, benzyl (meth)acrylate, phenyl (meth)acrylate, isobornyl (meth)acrylate, isobutyl (meth)acrylate, acryloyl morpholine, dimethyl itaconate, N-vinyl pyrollidone, N-vinyl caprolactam, N-vinyl imidazole, or N-methyl-N-vinylacetamide.

74) The composition or kit according to any one of the preceding exemplary embodiments, wherein the TPA-based polyester comprises a polymerizable group comprising acrylate, methacrylate, itaconate, vinyl ether, allyl ether, maleate, or fumarate and the first network monomer comprises cyclohexyl vinyl ether, 1,4,-cyclohexanedimethanol mono vinyl ether, tert-Butyl vinyl ether, phenyl vinyl ether, allyl phenyl ether, dimethyl maleate, diethyl maleate, dimethyl fumarate, or diethyl fumarate.

75) The composition or kit according to any one of the preceding exemplary embodiments, wherein the TPA-based polyester comprises a polymerizable group comprising hydroxyl, epoxy, oxetane, or vinyl ether and the one or more first network monomers comprise cyclohexene oxide, tert-butyl glycidyl ether, 4-chlorophenyl glycidyl ether, cyclopentene oxide, exo-2,3-Epoxynorbornane, 1,2-Epoxy-3-phenoxypropane, (2,3-Epoxypropyl)benzene, N-(2,3-Epoxypropyl)phthalimide, exo-3,6-Epoxy-1,2,3,6-tetrahydrophthalic anhydride, 3,4-Epoxytetrahydrothiophene-1,1-dioxide, Furfuryl glycidyl ether, glycidyl 4-methoxyphenyl ether, glycidyl 2-methylphenyl ether, isophorone oxide, α-Pinene oxide, cis-stilbene oxide, styrene oxide, Methyl 7-oxabicyclo[4.1.0]heptane-3-carboxylate, 2-Ethylhexyl 7-oxabicyclo(4.1.0)heptane-3-carboxylate, 3-ethyl-3-hydroxymethyloxetane, 3-ethyl-3-(3-hydroxypropyl)oxymethyloxetane, 3-ethyl-3-(4-hydroxybutyl)oxymethyloxetane, cyclohexyl vinyl ether, 1,4,-cyclohexanedimethanol mono vinyl ether, tert-Butyl vinyl ether, or phenyl vinyl ether.

76) The composition or kit according to any one of the preceding exemplary embodiments, wherein the one or more first network monomers are present in an amount of at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition.

77) The composition or kit according to any one of the preceding exemplary embodiments, wherein the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.

78) The composition or kit according to any one of the preceding exemplary embodiments, wherein the one or more first network monomers are present in an amount of at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent.

79) The composition or kit according to any one of the preceding exemplary embodiments, wherein the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.

80) The composition or kit according to any one of the preceding exemplary embodiments, wherein the one or more first network monomers are present in an amount of at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the first network-forming component.

81) The composition or kit according to any one of the preceding exemplary embodiments, wherein the one or more first network monomers are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the first network-forming component.

82) The composition or kit according to any one of the preceding exemplary embodiments, wherein the one or more first network initiators comprise a photo-initiator or a thermal initiator.

83) The composition or kit according to any one of the preceding exemplary embodiments, wherein the one or more first network initiators comprise a photo-initiator that initiates polymerization in response to UV light, visible light, or both UV light and visible light.

84) The composition or kit according to any one of the preceding exemplary embodiments, wherein the one or more first network initiators comprise a photo-initiator that initiates polymerization at a wavelength of from 300 to 470 nm.

85) The composition or kit according to any one of the preceding exemplary embodiments, wherein the one or more first network initiators comprise a photo-initiator that initiates polymerization at a wavelength of from 300 to 395 nm.

86) The composition or kit according to any one of the preceding exemplary embodiments, wherein the one or more first network initiators comprise a photo-initiator and a thermal initiator.

87) The composition or kit according to any one of the preceding exemplary embodiments, wherein the one or more first network initiators comprise a thermal initiator.

88) The composition or kit according to any one of the preceding exemplary embodiments, wherein the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition.

89) The composition or kit according to any one of the preceding exemplary embodiments, wherein the one or more first network monomers are present in an amount of at most 10 wt %, at most 8 wt %, at most 7 wt %, at most 6 wt %, at most 5 wt %, or at most 4 wt %, based on the total weight of the composition.

90) The composition or kit according to any one of the preceding exemplary embodiments, wherein the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition excluding any solvent.

91) The composition or kit according to any one of the preceding exemplary embodiments, wherein the one or more first network monomers are present in an amount of at most 10 wt %, at most 8 wt %, at most 7 wt %, at most 6 wt %, at most 5 wt %, or at most 4 wt %, based on the total weight of the composition excluding any solvent.

92) The composition or kit according to any one of the preceding exemplary embodiments, wherein the one or more first network initiators are present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the first network-forming component.

93) The composition or kit according to any one of the preceding exemplary embodiments, wherein the one or more first network initiators are present in an amount of at most 10 wt %, at most 8 wt %, at most 7 wt %, at most 6 wt %, at most 5 wt %, or at most 4 wt %, based on the total weight of the first network-forming component.

94) The composition or kit according to any one of the preceding exemplary embodiments, wherein the further first network monomer, oligomer, or polymer is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the composition.

95) The composition or kit according to any one of the preceding exemplary embodiments, wherein the further first network monomer, oligomer, or polymer is present in an amount of at least 0.5 wt %, at least 1 wt %, at least 1.5 wt %, at least 2 wt %, at least 2.5 wt %, at least 4 wt %, or at least 5 wt %, based on the total weight of the composition.

96) The composition or kit according to any one of the preceding exemplary embodiments, wherein the further first network monomer, oligomer, or polymer is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the composition excluding any solvent.

97) The composition or kit according to any one of the preceding exemplary embodiments, wherein the further first network monomer, oligomer, or polymer is present in an amount of at least 0.5 wt %, at least 1 wt %, at least 1.5 wt %, at least 2 wt %, at least 2.5 wt %, at least 4 wt %, or at least 5 wt %, based on the total weight of the composition excluding any solvent.

98) The composition or kit according to any one of the preceding exemplary embodiments, wherein the further first network monomer, oligomer, or polymer is present in an amount of at most 15 wt %, at most 12 wt %, at most 10 wt %, at most 8 wt %, at most 6 wt %, at most 5 wt %, at most 4 wt %, at most 3 wt %, or at most 2 wt %, based on the total weight of the first network-forming component.

99) The composition or kit according to any one of the preceding exemplary embodiments, wherein the further first network monomer, oligomer, or polymer is present in an amount of at least 0.5 wt %, at least 1 wt %, at least 1.5 wt %, at least 2 wt %, at least 2.5 wt %, at least 4 wt %, or at least 5 wt %, based on the total weight of the first network-forming component.
100) The composition or kit according to any one of the preceding exemplary embodiments, wherein the TPA-based polyester comprises polymerizable groups comprising acrylate, methacrylate, or itaconate, and the one or more second network compounds comprises polymerizable groups that comprise epoxy, oxetane, or hydroxyl.
101) The composition or kit according to any one of the preceding exemplary embodiments, wherein the TPA-based polyester comprises polymerizable groups comprising epoxy, oxetane, or hydroxyl, and the one or more second network compounds comprises polymerizable groups that comprise acrylate, methacrylate, or itaconate.
102) The composition or kit according to any one of the preceding exemplary embodiments, wherein the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition.
103) The composition or kit according to any one of the preceding exemplary embodiments, wherein second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition.
104) The composition or kit according to any one of the preceding exemplary embodiments, wherein the composition is devoid of second network-forming component.
105) The composition or kit according to any one of the preceding exemplary embodiments, wherein the composition is substantially devoid of second network-forming component.
106) The composition or kit according to any one of the preceding exemplary embodiments, wherein the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition, excluding the weight of any solvent.
107) The composition or kit according to any one of the preceding exemplary embodiments, wherein the second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition excluding any solvent.
108) The composition or kit according to any one of the preceding exemplary embodiments, wherein the second network-forming component is present in an amount of 5 wt % or more, 10 wt % or more, 15 wt % or more, 20 wt % or more, 25 wt % or more, 30 wt % or more, 35 wt % or more, 40 wt % or more, 50 wt % or more, 60 wt % or more, or 70 wt % or more, based on the total weight of the composition excluding any solvent and any components that do not comprise a polymerizable group.
109) The composition or kit according to any one of the preceding exemplary embodiments, wherein the second network-forming component is present in an amount of 90 wt % or less, 80 wt % or less, 70 wt % or less, 60 wt % or less, 50 wt % or less, 40 wt % or less, 30 wt % or less, or 20 wt % or less, based on the total weight of the composition excluding any solvent and any components that do not comprise a polymerizable group.
110) The composition or kit according to any one of the preceding exemplary embodiments, wherein the one or more second network compounds are present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition.
111) The composition or kit according to any one of the preceding exemplary embodiments, wherein the one or more second network compounds are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition.
112) The composition or kit according to any one of the preceding exemplary embodiments, wherein the one or more second network compounds are present in an amount of at least 5 wt %, at least 10 wt %, at least 15 wt %, at least 19.95 wt %, at least 20 wt %, at least 25 wt %, at least 30 wt %, at least 40 wt %, at least 50 wt %, at least 60 wt %, at least 70 wt %, or at least 80 wt %, based on the total weight of the composition excluding any solvent.
113) The composition or kit according to any one of the preceding exemplary embodiments, wherein the one or more second network compounds are present in an amount of at most 80 wt %, at most 78 wt %, at most 75 wt %, at most 70 wt %, at most 60 wt %, at most 50 wt %, at most 40 wt %, at most 30 wt %, or at most 20 wt %, based on the total weight of the composition excluding any solvent.
114) The composition or kit according to any one of the preceding exemplary embodiments, wherein the one or more second network compounds are present in an amount of at least 50 wt %, at least 60 wt %, at least 70 wt %, at least 80 wt %, or at least 90 wt %, based on the total weight of the second network-forming component.
115) The composition or kit according to any one of the preceding exemplary embodiments, wherein the one or more second network compounds are present in an amount of at most 99.9 wt %, at most 99.5 wt %, at most 99 wt %, at most 98 wt %, at most 97 wt %, at most 96 wt %, at most 95 wt %, at most 90 wt %, or at most 80 wt %, based on the total weight of the second network-forming component.
116) The composition or kit according to any one of the preceding exemplary embodiments, wherein the second network initiator comprises a photo-initiator or a thermal initiator.
117) The composition or kit according to any one of the preceding exemplary embodiments, wherein the second network initiator comprises a photo-initiator that initiates polymerization in response to UV light, visible light, or both UV light and visible light.
118) The composition or kit according to any one of the preceding exemplary embodiments, wherein the second network initiator comprises a photo-initiator and a thermal initiator.

119) The composition or kit according to any one of the preceding exemplary embodiments, wherein the second network initiator is present in an amount at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the composition excluding any solvent.
120) The composition or kit according to any one of the preceding exemplary embodiments, wherein the second network initiator is present in an amount of at most 10 wt %, at most 8 wt %, at most 7 wt %, at most 6 wt %, at most 5 wt %, or at most 4 wt %, based on the total weight of the composition excluding any solvent.
121) The composition or kit according to any one of the preceding exemplary embodiments, wherein the second network initiator is present in an amount of at least 0.01 wt %, at least 0.05 wt %, at least 0.1 wt %, at least 0.2 wt %, at least 0.3 wt %, at least 0.4 wt %, at least 0.5 wt %, at least 1.0 wt %, at least 1.5 wt %, at least 2 wt %, or at least 2.5 wt %, based on the total weight of the second network-forming component.
122) The composition or kit according to any one of the preceding exemplary embodiments, wherein the second network initiator is present in an amount of at most 10 wt %, at most 8 wt %, at most 7 wt %, at most 6 wt %, at most 5 wt %, or at most 4 wt %, based on the total weight of the second network-forming component.
123) The composition or kit according to any one of the preceding exemplary embodiments, wherein the composition further comprises an organic or inorganic particulate filler, such as $SiO_2$, $AlO_2$, $TiO_2$, $ZnO_2$, $SnO_2$, Am—$SnO_2$, $ZrO_2$, Sb—$SnO_2$, $Al_2O_3$, or carbon black.
124) The composition or kit according to any one of the preceding exemplary embodiments, wherein the composition further comprises a particulate filler comprising a polymerizable group that is able to (co)polymerize with the polymerizable groups of the TPA-based polyester.
125) The composition or kit according to any one of the preceding exemplary embodiments, wherein the particulate filler comprises a polymerizable group that is able to (co)polymerize with the polymerizable groups of the one or more second network compounds.
126) The composition or kit according to any one of the preceding exemplary embodiments, wherein the particulate filler comprises a polymerizable group comprising acrylate, methacrylate, epoxy, oxetane, hydroxyl, itaconate, vinyl ether, allyl ether, maleate, or fumarate.
127) The composition or kit according to any one of the preceding exemplary embodiments, wherein the particulate filler comprises a polymerizable group comprising acrylate, methacrylate, epoxy, oxetane, hydroxyl, or itaconate.
128) The composition or kit according to any one of the preceding exemplary embodiments, wherein the particulate filler comprises a polymerizable group comprising acrylate or methacrylate.
129) The composition or kit according to any one of the preceding exemplary embodiments, wherein the particulate filler comprises a polymerizable group comprising epoxy, oxetane or hydroxyl.
130) The composition or kit according to any one of the preceding exemplary embodiments, wherein particulate filler comprises an impact modifier.
131) The composition or kit according to any one of the preceding exemplary embodiments, wherein the particulate filler is present in the composition in an amount of 1 wt % or more, 5 wt % or more, 10 wt % or more, 15 wt % or more, 20 wt % or more, 30 wt % or more, 40 wt % or more, or 50 wt % or more, based on the total weight of the composition.
132) The composition or kit according to any one of the preceding exemplary embodiments, wherein the particulate filler is present in the composition in an amount of 90 wt % or less, 80 wt % or less, 70 wt % or less, 60 wt % or less, 50 wt % or less, 40 wt % or less, 30 wt % or less, or 20 wt % or less, based on the total weight of the composition.
133) The composition or kit according to any one of the preceding exemplary embodiments, wherein the composition further comprises a stabilizer, such as a viscosity stabilizer or light stabilizer, a UV absorber, a dye, a pigment, a plasticizer, a surfactant, an antioxidant, a wetting agent, a photosensitizer, a defoamer, a flame retardant, a silane coupling agent, an acid scavenger, an accelerators for a thermal initiator, and/or a bubble breaker.
134) The composition or kit according to any one of the preceding exemplary embodiments, wherein the composition further comprises a non-particulate impact modifier.
135) The composition or kit according to any one of the preceding exemplary embodiments, wherein the composition further comprises a non-particulate impact modifier and the non-particulate impact modifier does not comprise a polymerizable group.
136) The composition or kit according to any one of the preceding exemplary embodiments, wherein the composition further comprises a non-particulate impact modifier and the non-particulate impact modifier comprises a polymerizable group.
137) The composition or kit according to any one of the preceding exemplary embodiments, wherein the non-particulate impact modifier comprises a block copolymer.
138) The composition or kit according to any one of the preceding exemplary embodiments, wherein the further first network monomer, oligomer, or polymer comprises a non-particulate impact modifier comprising a polymerizable group.
139) The composition or kit according to any one of the preceding exemplary embodiments, wherein the second network compound comprises a non-particulate impact modifier comprising a polymerizable group.
140) The composition or kit according to any one of the preceding exemplary embodiments, wherein the composition comprises 50 wt % or less of solvent, based on the total weight of the composition, wt % or less, 30 wt % or less, 20 wt % or less, 10 wt % or less, 5 wt % or less, or 0 wt %.
141) The composition or kit according to any one of the preceding exemplary embodiments, the viscosity of the composition at 30° C. is 4000 cps or less, 3000 cps, or less, 2000 cps or less, 1500 cps or less, or 1200 cps or less.
142) The composition or kit according to any one of the preceding exemplary embodiments, wherein the viscosity of the composition at 30° C. is 300 cps or more.

143) The composition or kit according to any one of the preceding exemplary embodiments, wherein the composition or liquid sub-composition further comprises a dispersing medium.
144) The composition according to any one of the preceding exemplary embodiments, wherein the composition further comprises from 20 to 70 wt % of a dispersing medium.
145) The kit according to any one of the preceding exemplary embodiments, wherein the liquid sub-composition further comprises from 20 to 80 wt % of a dispersing medium.
146) The composition or kit according to any one of the preceding exemplary embodiments, wherein the composition or liquid sub-composition further comprises a dispersing medium and the dispersing medium comprises water.
147) The composition or kit according to any one of the preceding exemplary embodiments, wherein the composition or liquid sub-composition further comprises a dispersing medium and the dispersing medium consists of water.
148) An article formed by polymerizing the composition, the composition optionally formed by combining the elements of the kit, according to any one of the preceding exemplary embodiments.
149) An article formed by polymerizing the composition, the composition optionally formed by combining the elements of the kit, according to any one of the preceding exemplary embodiments, wherein a film formed by polymerizing 90% or more of total the polymerizable groups in the composition has a tensile modulus as measured at 150° C. of from 3, from 5, from 7, from 10, from 15, or from 20 MPa to 50, to 45, or to 40 MPa, as determined by DMTA in accordance with ASTM D5026.
150) An article formed by polymerizing the composition, the composition optionally formed by combining the elements of the kit, according to any one of the preceding exemplary embodiments, wherein a film formed by polymerizing 90% or more of total the polymerizable groups in the composition has a yield stress at 23° C. of from 50 to 90 MPa, and an elongation at break at 23° C. of greater than 3%, as determined according to ISO 37:2011.
151) An article formed by polymerizing the composition, the composition optionally formed by combining the elements of the kit, according to any one of the preceding exemplary embodiments, wherein a film formed by polymerizing 90% or more of total the polymerizable groups in the composition has a tensile modulus as measured at 23° C. of from 2000 to 3500 MPa, as determined according to ISO 37:2011.
152) An article formed by polymerizing the composition, the composition optionally formed by combining the elements of the kit, according to any one of the preceding exemplary embodiments, wherein a film formed by polymerizing 90% or more of total the polymerizable groups has elongation at break at 23° C. of greater than 3% and less than 20%, less than 15%, or less than 10%.
153) A method of forming a three-dimensional object comprising the steps of providing a composition according to any one of the preceding exemplary embodiments, or a composition formed by combining the elements of the kit according to any one of the preceding exemplary embodiments, and polymerizing the composition.
154) A method of forming a three-dimensional object comprising the steps of forming a layer of the composition according to any one of the preceding exemplary embodiments, or a composition formed by combining the elements of the kit according to any one of the preceding exemplary embodiments, curing the composition with radiation to form a desired shape, and repeating the steps of forming and curing a plurality of times to obtain a three-dimensional object.
155) A method of forming a three-dimensional object comprising the steps of selectively dispensing the composition according to any one of the preceding exemplary embodiments, or a composition formed by combining the elements of the kit according to any one of the preceding exemplary embodiments, curing the composition with radiation to form a desired shape, and repeating the steps of selectively dispensing and curing a plurality of times to obtain a three-dimensional object.
156) A method of forming a three-dimensional object comprises the steps of forming a layer of the composition according to any one of the preceding exemplary embodiments, or a composition formed by combining the elements of the kit according to any one of the preceding exemplary embodiments, selectively curing the layer with radiation to form a desired shape, and repeating the steps of forming and selectively curing a layer of the composition a plurality of times to obtain a three-dimensional object.
157) A method of forming a three-dimensional article by polymerizing the composition according to any one of the preceding exemplary embodiments, or by polymerizing a composition formed by combining the elements of the kit according to any one of the preceding exemplary embodiments, the method comprising the steps of forming a layer from a first composition comprising the TPA-based polyester and selectively dispensing a second composition comprising one or more first network monomers onto the first composition in accordance with the shape of a portion of a three-dimensional object, wherein the one or more first network initiators are present either in the layer of TPA-based polyester, in the composition comprising the one or more first network monomers, or both.
158) A method of forming a three-dimensional article from the kit of any one of the preceding exemplary embodiments, comprising the steps of forming a layer of the particulate sub-composition; selectively dispensing, such as by jetting, or non-selectively dispensing the liquid sub-composition; optionally selectively applying or non-selectively applying radiation to thereby induce curing of the particulate sub-composition and liquid sub-composition; and repeating the steps of forming, dispensing, and selectively curing a plurality of times in order to form a three-dimensional object.
159) The method according to any one of the preceding exemplary embodiments, further comprising the step of evaporating the dispersing medium.
160) The method according to any one of the preceding exemplary embodiments, wherein the composition is present as a liquid at the time of curing the composition, such as by initiating the polymerization reaction by the application of radiation, such as light or heat.

161) The method according to any one of the preceding exemplary embodiments, wherein the composition is present as a liquid at the time of curing the composition, such as by initiating the polymerization reaction by the application of radiation, such as light or heat, and wherein the liquid composition possesses a temperature of 25° or more, 30° C. or more, 35° C. or more, 40° C. or more, or 45° C. or more at the time that polymerization is initiated.

162) The method according to any one of the preceding exemplary embodiments, wherein the composition is present as a liquid at the time of curing the composition, such as by initiating the polymerization reaction by the application of radiation, such as light or heat, and wherein the liquid composition possesses a temperature of 200° C. or less, 180° C. or less, 150° C. or less, 100° C. or less, 80° C. or less, or 50° C. or less, at the time that polymerization is initiated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. While certain optional features are described as embodiments of the invention, the description is meant to encompass and specifically disclose all combinations of these embodiments unless specifically indicated otherwise or physically impossible.

The invention claimed is:

1. A composition for forming a three-dimensional object via an additive fabrication process comprising:
   a. from 30 to 100 wt %, based on the total weight of the composition, of a first network-forming component consisting of:
      i. from 19.95 to 80 wt %, based on the total weight of the first network-forming component, of a TPA-based polyester comprising a backbone and having a number average of at least 2 polymerizable groups, wherein the backbone comprises the reaction product of one or more polyacids including a terephthalic acid and a polyol, wherein the polymerizable groups comprise acrylate, methacrylate, epoxy, oxetane, hydroxyl, itaconate, vinyl ether, allyl ether, maleate, or fumarate, and wherein the TPA-based polyester has a number average molecular weight of from 800 to 10000 g/mol and a Tg of at least 25° C.;
      ii. from 19.95 to 80 wt %, based on the total weight of the network-forming component, of one or more first network monomers having a number average of 0.95 to 1.1 polymerizable groups that are able to (co)polymerize with the polymerizable groups of the TPA-based polyester, wherein a linear polymer formed from the one or more first network monomers has a Tg of at least 25° C.;
      iii. from 0.05 to 5 wt %, based on the total weight of the first network-forming component, of one or more first network initiators capable of initiating the polymerization of the TPA-based polyester and the first network monomer; and
      iv. optionally, up to 15 wt % of one or more further first network monomers, oligomers, or polymers having a number average of 2 or more polymerizable groups that are able to (co)polymerize with the polymerizable groups of the TPA-based polyester or the one or more first-network monomers;
   b. optionally, a second network-forming component comprising one or more second network compounds comprising polymerizable groups that do not (co)polymerize with the polymerizable groups of the TPA-based polyester, and a second network initiator for initiating the polymerization of the one or more second network compounds; and
   c. optionally, a particulate filler comprising a polymerizable group that is able to (co)polymerize with the polymerizable groups of the TPA-based polyester.

2. The composition of claim 1, wherein the first network initiator comprises a photo-initiator.

3. The composition of claim 2, wherein a film formed by polymerizing 90% or more of total the polymerizable groups in the composition has a tensile modulus measured at 150° C. of from 3 and 50 MPa and a Tg of 40° C. or higher.

4. The composition according to claim 1, wherein the polymerizable groups comprise endgroups.

5. The composition according to claim 4, wherein the polymerizable groups consist of endgroups.

6. The composition of claim 4, wherein the TPA-based polyester has a number average of from 2 to 3 endgroups, and
wherein the amount, number average molecular weight, and number average of endgroups of the TPA-based polyester in the composition satisfies the following equation:

$$X \, MPa \leq 3*R*T*\left[(3-f)*\left(\frac{\rho * w_{polyester}}{M_{polyester}}\right) + (f-2)*3*\left(\frac{\rho * w_{polyester}}{M_{polyester}}\right)\right] \leq Y \, MPa$$

wherein R is the gas constant 8.314 cm$^3$ MPa K$^{-1}$ mol$^{-1}$, T is 423.15 K, $f$ is the number average of endgroups of the TPA-based polyester, $\rho$ is the density of the TPA-based polyester in g/cm$^3$, $M_{polyester}$ is the number average molecular weight of the TPA-based polyester in g/mol, $w_{polyester}$ is the weight fraction of the TPA-based polyester in the first network-forming component, X is 3, and Y is 50.

7. The composition of claim 2, wherein at least 50 mol % of the one or more polyacids consists of the terephthalic acid.

8. The composition of claim 7, wherein at least 75 mol % of the one or more polyacids consists of the terephthalic acid.

9. The composition of claim 7, wherein the TPA-based polyester has a number average of from 2 to 3 endgroups.

10. The composition of claim 7, wherein the TPA-based polyester has a number average molecular weight of from 800 to 8000 g/mol.

11. The composition of claim 4, wherein a linear polymer formed from the one or more first network monomers has a Tg of 60° C. or more.

12. The composition of claim 10, wherein the one or more first network monomers have a molecular weight of 300 g/mol or less.

13. The composition of claim 12, wherein the one or more first network monomers comprises methyl (meth)acrylate, hydroxy ethyl (meth)acrylate, hydroxy propyl (meth)acrylate, cyclohexyl (meth)acrylate, benzyl (meth)acrylate, isobornyl (meth)acrylate, or isobutyl (meth)acrylate.

14. The composition of claim 10, wherein the one or more first network monomers comprises cyclohexene oxide, tert-butyl glycidyl ether, 4-chlorophenyl glycidyl ether, cyclopentene oxide, exo-2,3-Epoxynorbornane, 1,2-Epoxy-3-phenoxypropane, (2,3-Epoxypropyl)benzene, N-(2,3-Epoxypropyl)phthalimide, exo-3,6-Epoxy-1,2,3,6-tetrahydrophthalic anhydride, 3,4-Epoxytetrahydrothiophene-1,1-dioxide, Furfuryl glycidyl ether, glycidyl 4-methoxyphenyl ether, glycidyl 2-methylphenyl ether, isophorone oxide, α-Pinene oxide, cis-stilbene oxide, styrene oxide, Methyl,Methyl 7-oxabicyclo[4.1.0]heptane-3-carboxylate, 22-Ethylhexyl 7-oxabicyclo(4.1.0)heptane-3-carboxylate, 3-ethyl-3-hydroxymethyloxetane, 3-ethyl-3-(3-hydroxypropyl)oxymethyloxetane, or 3-ethyl-3-(4-hydroxybutyl)oxymethyloxetane.

15. A method of forming a three-dimensional object comprising the steps of:
a. forming a layer of the composition according to claim 1,
b. curing the layer with electromagnetic radiation in order to form a desired shape, and
c. repeating the steps of forming and curing a plurality of times to obtain a three-dimensional object.

16. A kit of materials comprising a particulate sub-composition and a liquid sub-composition, which when combined forms a composition for forming an object by an additive fabrication process that comprises a first-network forming component comprising polymerizable groups, and optionally a second network-forming component that does not (co)polymerize with the polymerizable groups of the first-network forming component, the kit comprising:
a. a particulate sub-composition comprising:
i. from 19.95 to 80 wt. %, based on the total weight of the first network-forming component, of a TPA-based polyester comprising a backbone and having a number average of at least 2 polymerizable groups, wherein the backbone comprises the reaction product of one or more polyacids including a terephthalic acid and a polyol, wherein the polymerizable groups comprise acrylate, methacrylate, epoxy, oxetane, hydroxyl, itaconate, vinyl ether, allyl ether, maleate, or fumarate, and wherein the TPA-based polyester has a number average molecular weight of from 800 to 10000 g/mol and a Tg of at least 40° C.;
ii. optionally, a particulate filler comprising a polymerizable group that is able to (co)polymerize with the polymerizable groups of the TPA-based polyester;
b. a liquid sub-composition comprising:
i. from 19.95 to 80 wt. %, based on the total weight of the network-forming component, of one or more first network monomers having a number average of 0.95 to 1.1 polymerizable groups that are able to (co)polymerize with the polymerizable groups of the TPA-based polyester, wherein a linear polymer formed from the one or more first network monomers has a Tg of 40° C. or more;
ii. optionally, up to 15 wt. % of one or more further first network monomers, oligomers, or polymers having a number average of 2 or more polymerizable groups that are able to (co)polymerize with the polymerizable groups of the TPA-based polyester or the one or more first-network monomers;
c. from 0.05 to 5 wt. %, based on the total weight of the first network-forming component, of one or more first network initiators capable of initiating the polymerization of the TPA-based polyester and the first network monomer, wherein the one or more first network initiators may be present in the particulate sub-composition, the liquid sub-composition, or both; and
d. optionally, a second network-forming component comprising one or more second network compounds comprising polymerizable groups that do not (co)polymerize with the polymerizable groups of the TPA-based polyester, and a second network initiator for initiating the polymerization of the one or more second network compounds, wherein the substituents of the second network-forming component may be present in the particulate sub-composition, the liquid sub-composition, or partially in the particulate sub-composition and partially in the liquid sub-composition.

17. The kit according to claim 16, wherein the first network-forming component is present in an amount of 90 wt. % or more, based on the total weight of the composition excluding the weight of any solvent and the weight of any components that do not comprise a polymerizable group.

18. The kit according to claim 17, wherein at least 90 mol % of the one or more polyacids consists of the terephthalic acid.

19. The kit according to claim 18, wherein the one or more polyacids consists of terephthalic acid.

* * * * *